United States Patent
Sakakura et al.

(10) Patent No.: US 7,554,260 B2
(45) Date of Patent: Jun. 30, 2009

(54) DISPLAY DEVICE PROVIDED WITH A CONDUCTIVE FILM CONNECTION BETWEEN A WIRING COMPONENT AND A METAL ELECTRODE FILM

(75) Inventors: Masayuki Sakakura, Ebina (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 646 days.

(21) Appl. No.: 11/168,411

(22) Filed: Jun. 29, 2005

(65) Prior Publication Data
US 2006/0006794 A1   Jan. 12, 2006

(30) Foreign Application Priority Data
Jul. 9, 2004   (JP)   ............... 2004-203628

(51) Int. Cl.
*H05B 33/00*   (2006.01)
*H01L 51/50*   (2006.01)

(52) U.S. Cl. .............. 313/503; 313/500; 313/504; 313/505; 349/139; 349/142

(58) Field of Classification Search ......... 313/500–512; 349/139, 142, 143
See application file for complete search history.

(56) References Cited

U.S. PATENT DOCUMENTS

| | | | |
|---|---|---|---|
| 5,633,311 A | 5/1997 | Yamamoto et al. | |
| 5,640,067 A | 6/1997 | Yamauchi et al. | |
| 5,684,365 A | 11/1997 | Tang et al. | |
| 6,157,127 A | * 12/2000 | Hosokawa et al. | .......... 313/506 |
| 6,166,396 A | 12/2000 | Yamazaki | |
| 6,437,341 B1 | 8/2002 | Izumi et al. | |
| 6,710,825 B2 | 3/2004 | Kubo et al. | |
| 6,737,306 B2 | 5/2004 | Yamazaki et al. | |

(Continued)

FOREIGN PATENT DOCUMENTS

CN   1338655   3/2002

(Continued)

OTHER PUBLICATIONS

Kimura.M et al., "Analysis, Detection and Repair of Pixel Shorts in PM-OLEDs,", Asia Display / IDW '05, 2005, pp. 605-608.

*Primary Examiner*—Mariceli Santiago
(74) *Attorney, Agent, or Firm*—Eric J. Robinson; Robinson Intellectual Property Law Office, P.C.

(57) ABSTRACT

It is an object of the present invention to prevent a bright pixel defect caused by continuous current flow into a pixel, or to provide a display device in which effects on the surrounding pixels due to concentration of current on a part of the pixel can be suppressed. A display device according to the invention has a wiring for supplying current provided over an insulating surface, and a pixel electrode connected to the wiring. The pixel electrode has a layered structure of a plurality of different conductive films. Further, the pixel electrode has a narrow width region at least in a region where the wiring and the pixel electrode are electrically connected to each other. For example, a layered structure of a metal film and a transparent electrode can be used as a plurality of different conductive films.

21 Claims, 12 Drawing Sheets

U.S. PATENT DOCUMENTS

| | | |
|---|---|---|
| 6,778,233 B2 | 8/2004 | Matsuura et al. |
| 6,822,629 B2 | 11/2004 | Yamazaki et al. |
| 6,828,950 B2 | 12/2004 | Koyama |
| 6,828,952 B2 | 12/2004 | Jinno |
| 6,950,160 B2 | 9/2005 | Kubo et al. |
| 7,145,624 B2 | 12/2006 | Kubo et al. |
| 7,215,395 B2 | 5/2007 | Kubo et al. |
| 2002/0024298 A1 | 2/2002 | Fukunaga |
| 2002/0063844 A1 | 5/2002 | Matsuura et al. |
| 2003/0156239 A1* | 8/2003 | Inoue et al. ............ 349/113 |
| 2003/0214248 A1 | 11/2003 | Jinno |
| 2003/0227021 A1 | 12/2003 | Yamazaki et al. |
| 2004/0032202 A1 | 2/2004 | Fukunaga |
| 2004/0241931 A1 | 12/2004 | Akimoto et al. |
| 2004/0256979 A1 | 12/2004 | Murakami et al. |
| 2005/0003232 A1 | 1/2005 | Shitagaki et al. |
| 2005/0151146 A1 | 7/2005 | Lee et al. |
| 2005/0174500 A1 | 8/2005 | Shiraki et al. |
| 2005/0230684 A1* | 10/2005 | Seo et al. ............... 257/72 |
| 2005/0242713 A1* | 11/2005 | Yamazaki ............ 313/503 |
| 2006/0278874 A1 | 12/2006 | Kubo et al. |
| 2007/0114530 A1 | 5/2007 | Kimura |

FOREIGN PATENT DOCUMENTS

| | | |
|---|---|---|
| CN | 1505167 | 6/2004 |
| JP | 05-019294 | 1/1993 |
| JP | 05-100237 | 4/1993 |
| JP | 11-119250 | 4/1999 |
| JP | 2000-231121 | 8/2000 |
| JP | 2001-237082 | 8/2001 |
| JP | 2002-162914 | 6/2002 |
| JP | 2004-006339 | 1/2004 |
| JP | 2005-252228 | 9/2005 |
| WO | WO-2004/043937 | 5/2004 |

* cited by examiner

DISPLAY DEVICE PROVIDED WITH A CONDUCTIVE FILM CONNECTION BETWEEN A WIRING COMPONENT AND A METAL ELECTRODE FILM

BACKGROUND OF THE INVENTION

1. Field of the Invention

The present invention relates to a display device. The invention particularly relates to a structure of a pixel electrode in a display device.

2. Description of the Related Art

In recent years, a light emitting element using a light emitting organic compound has been actively researched and developed as a type of light emitting element. A typical light emitting element has a layer containing a light emitting organic compound (light emitting layer) interposed between a pair of electrodes. An electron and a hole are respectively injected and transported from each of electrodes to the light emitting layer by applying voltage to the element. The light emitting organic compound is excited by recombination of those carriers (an electron and a hole) and emits light in returning from the excited state to a ground state.

Such a light emitting element can be formed with a thin film having a thickness of submicrometer to several micrometers. Since light is emitted in only microseconds or less after carriers are injected, the response speed is extremely high, which is a feature of such a light emitting element. Further, enough light can be obtained with direct current voltage of several volts to several tens of volts; thus, the power consumption is also low in comparison. Because of such advantages, the above light emitting element attracts attention as a next generation flat panel display element.

In such a light emitting element, since a pair of electrodes and a light emitting layer are formed to a film shape, a large area element can be formed; thus, planar light emission can easily be realized. Since this feature is difficult to obtain with a light source such as an incandescent lamp or an LED (point source), or a fluorescent lamp (linear light source); therefore, the above light emitting element is also expected to be used as a light source of a lighting.

Further, as a method for displaying an image on a display device, a passive matrix type and an active matrix type, where arbitrary display is performed by selecting lighting or non-lighting of each pixel in a display area including a plurality of pixels, are generally used. As to the passive matrix type, wirings are provided in a reticular pattern, and lighting or non-lighting of the area where the wirings in columns and wirings in rows cross is controlled, thereby displaying an image. As to the active matrix type, a thin film transistor (TFT) is provided in each pixel of a display device, and the pixel is controlled to emit light or not using the TFT as a switching element thereby displaying an image. The active matrix type can achieve higher contrast and lower power consumption drive than the passive matrix type; thus, it is applied to more display devices.

However, in an active matrix display device, for example, in the case where a failure due to damage, defect, or the like of a TFT provided in each pixel is caused, current or voltage to be supplied to the pixel becomes uncontrollable. As a result, high current is constantly supplied to a light emitting layer provided in the pixel; thus, the pixel could constantly emit light. Such a state where a pixel constantly emits light leads to a defect (bright pixel defect) where the pixel constantly emits light in displaying an image; thus, the salability of the display device significantly suffers.

Further, in a display device using a light emitting element, a light emitting layer is formed to be very thin; thus, a defect such as a pinhole can easily be caused in a part of the light emitting layer. When a defect is caused in a light emitting layer, short circuit is caused between an anode and a cathode and current is concentrated onto the defect portion; thus, high current flows into a pixel including the defect. Consequently, problems such as effects on surrounding pixels associated with increase in power consumption or increase in temperature of the defect portion are caused.

BRIEF SUMMARY OF THE INVENTION

The present invention has been made in view of the above problems and it is an object of the present invention to prevent a bright pixel defect caused by continuous current flow into a pixel, or to provide a display device in which effects on the surrounding pixels due to concentration of current on a part of the pixel are suppressed.

It is a feature of the invention that a display device according to the invention has a wiring for supplying current provided over an insulating surface, and a pixel electrode connected to the wiring; the pixel electrode has a layered structure of a metal film and a transparent electrode film except a part of the area where the wiring is connected to the pixel electrode; the pixel electrode has a narrow width region in the area where the wiring is connected to the pixel electrode; at least a part of the pixel electrode in the narrow width region is formed only of a transparent conductive film; and the wiring and the metal film are not in contact with each other.

Here, the state where the pixel electrode has the narrow width region signifies the state where the pixel electrode has a region narrower than the other part of the pixel electrode. Similarly, the state where the pixel electrode has the narrow width region in an area where the wiring and the pixel electrode are connected to each other signifies the state where the pixel electrode has a region narrower than the other part of the pixel electrode not only in the area of the pixel electrode where the wiring and the pixel electrode are in direct contact, but also in the surrounding area. As shown in FIGS. 6A to 6D, the pixel electrode specifically has protrusions (regions 17 and 19) in the area where the wiring and the pixel electrode are connected, and a width a of the region 17 and a width c of the region 19 are narrower than a width b of a region 18 which is the other part of the pixel electrode. The narrow width regions (the protrusions (the regions 17 and 19)) of the pixel electrode may have any shape as long as the widths are narrower than the width b of the region 18. For example, a constricted shape (b>c>a) as shown in FIG. 6A or a rectangular shape (b>a=c) as shown in FIG. 6B may be adopted. In addition, the width a of the region 17 is not necessarily provided uniformly, and the width a may increase toward the region 18. Alternatively, the width a may increase toward the region 19. Note that in the case where the pixel electrode is formed with a layered structure of a metal film and a transparent electrode film, at least a part of the region 17 is formed only of a transparent electrode, so that the metal film and the wiring does not touch each other.

Further, in the above structure, the pixel electrode is formed to have a layered structure of the metal film and the transparent electrode film except the area where the wiring and the pixel electrode are connected to each other; however, the transparent electrode film may be provided over the metal film, or the metal film may be provided over the transparent electrode film. In the case of providing the transparent electrode film over the metal film, the transparent electrode film may cover an end portion of the wiring. Meanwhile, in the case of providing the metal film over the transparent electrode film, the wiring may cover an end portion of the transparent electrode film.

Another structure of a display device according to the invention includes a wiring provided over an insulating surface, a metal film provided over the insulating surface so as not to directly contact the wiring, and a transparent electrode film provided so as to cover an end portion of the wiring and the metal film, and a light emitting layer provided over the transparent electrode film. Further, the transparent electrode film has a narrow width region between the wiring and the metal film.

Another structure of a display device according to the invention includes a transparent electrode film provided on an insulating surface, a wiring provided so as to cover an end portion of the transparent electrode film, a metal film provided over the transparent electrode film so as not to directly contact the wiring, and a light emitting layer provided over the metal film. Further, the transparent electrode film has a narrow width region between the wiring and the metal film.

In the invention, a single layer structure or a layered structure of an element selected from aluminum (Al), nickel (Ni), tungsten (W), molybdenum (Mo), titanium (Ti), platinum (Pt), copper (Cu), tantalum (Ta), gold (Au), and manganese (Mn), an alloy containing a plurality of the elements, or an alloy containing the element and carbon (C) can be used for the wiring or the metal film. Further, the wiring and the metal film can be formed of the same material, for example, an alloy containing Al and Ti and C, an alloy containing Al and Ni, or an alloy containing Al and Ni and C can be used.

The pixel electrode of the area where the wiring and the pixel electrode are connected may have any shape as long as a narrow width region is formed; for example, the pixel electrode may have a constricted shape.

According to the invention, an electrode, a wiring, a pixel electrode, a metal film, and an insulating film may be formed by photolithography or a droplet discharge method. Incidentally, a droplet discharge method is a method in which droplets (also referred to as dots) of a composition containing a material of a conductive film, an insulating film, or the like are selectively discharged (sprayed) onto an arbitrary position to form the film. A droplet discharge method includes an ink-jet method depending on the mode.

Further, a display device according to the invention can be applied to a liquid crystal display device, a display device using a light emitting element, or the like.

According to the invention, in a display device having a plurality of pixels, even in the case where a bright pixel defect is caused due to damage, defect, or the like of a TFT in a pixel, the bright pixel defect can be prevented. Further according to the invention, when a defect is caused in a pixel due to short circuit between an anode and a cathode, or the like; effects on the surrounding pixels associated with increase in power consumption or increase in temperature of the defect portion can be prevented by cutting off or reducing the current into the pixel.

DETAILED DESCRIPTION OF THE INVENTION

Embodiment

Figure 1A:
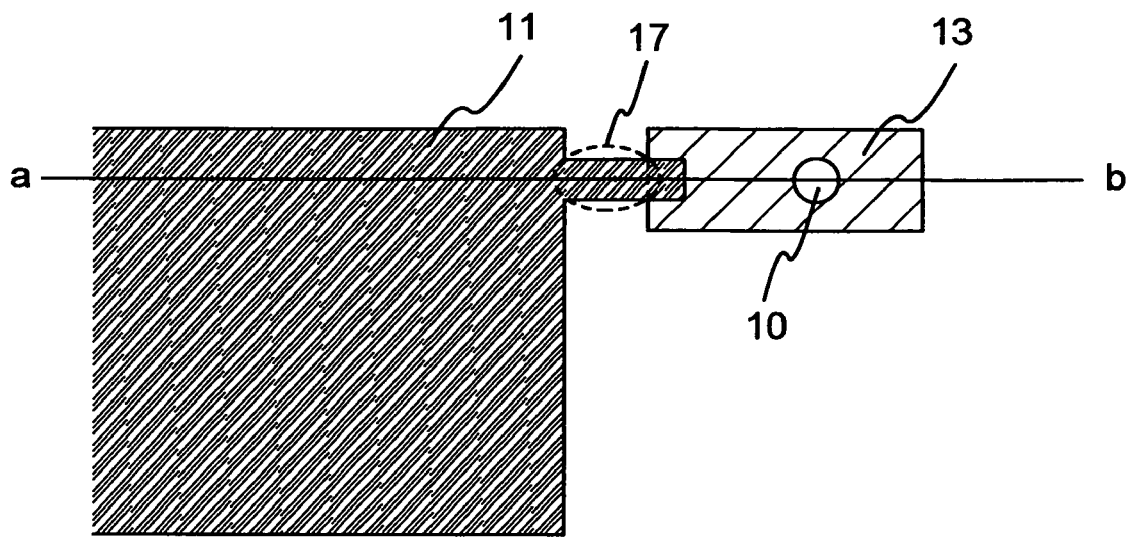
FIGS. 1A and 1B show a structure of a pixel electrode in a display device.

Embodiment Modes of the present invention will be described in detail with reference to the accompanying drawings. However, the invention is not limited to the following description and it is easily understood by those skilled in the art that various changes and modifications are possible, unless such changes and modifications depart from the content and the scope of the invention. Therefore, the invention is to be interpreted without limitation to the description in Embodiment Modes shown below. Note that, in the structure of the invention described hereinafter, the same reference numerals denote the same parts in different drawings.

The present invention relates to a structure of a display device having a plurality of pixels, in which when current higher than a current which can be controlled in a pixel (overcurrent) flows into a pixel, more current supplied into the pixel is selectively cut off or reduced. In order to achieve the object, a material by which the resistance of a pixel electrode itself increases when current above a certain level flows is used. For example, a metal material which has a property that the resistance thereof increases when current above a certain level flows is used for a pixel electrode. Alternatively, a layered structure including two or more layers which react to each other and whose resistance increases when current above a certain level flows can be used for the pixel electrode. Further, a structure in which when current above a certain level flows, a pixel electrode and a wiring connected to the pixel electrode react to each other and the resistance of the pixel electrode increases accordingly can be used.

As described above, in the invention, when current above a certain level flows into a pixel electrode, current flowing into to the pixel electrode is cut off or reduced by increasing the resistance of at least a part of the pixel electrode. The current flowing into the pixel electrode is preferably cut off or reduced in an area where the pixel electrode and a wiring for supplying current to the pixel electrode are connected to each other (a connection area). In other words, the current flowing into the pixel electrode is cut off at the entrance of the pixel electrode; thus, light emission of a pixel due to the current flowing into a light emitting layer can be effectively prevented. Therefore, when overcurrent flows into the pixel electrode, the resistance of the pixel electrode in the connection area of the pixel electrode and the wiring may be selectively increased.

In the invention, when current above a certain level flows into a pixel electrode, the resistance of the pixel electrode itself is increased. Accordingly, the shape of the pixel electrode of the connection area of the pixel electrode and the wiring preferably has a smaller width compared with the other part of the pixel electrode. As a result, the current density is higher in the narrower part in the pixel electrode than the other part of the pixel electrode; thus, the resistance of the narrower region in the pixel electrode can be selectively increased.

Further, the structure of a display device of the invention can be applied to any display device in which a plurality of pixels is arranged in matrix, for example to a liquid crystal display device, an EL display device using a light emitting element, or the like.

Specific modes of a display device having the above structure will be described below with reference to the drawings.

Embodiment Mode 1

In this embodiment mode, an example of a display device in which when overcurrent flows into a pixel, the current flowing into the pixel is cut off or reduced will be described below with reference to the drawing.

Figure 1B:
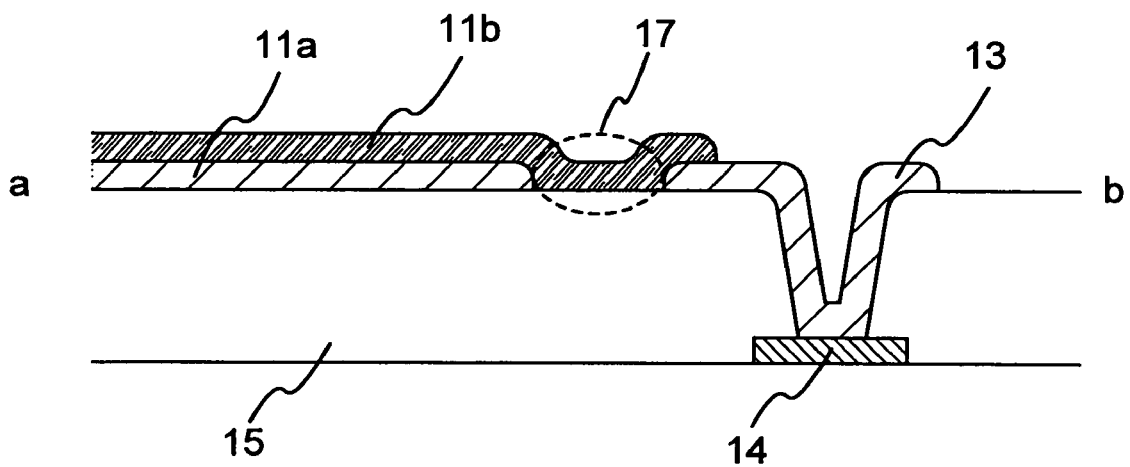

In FIGS. 1A and 1B, FIG. 1A shows a top view of a pixel electrode in a pixel of a display device, and FIG. 1B shows a cross-sectional view thereof. An interlayer insulating film 15 is formed so as to cover a wiring 14, and a contact hole 10 is formed in the interlayer insulating film 15. A pixel electrode 11 and the wiring 14 are electrically connected to each other through the contact hole 10. In this embodiment mode, the pixel electrode 11 except for a part thereof has a layered structure including a metal film 11a and a transparent electrode 11b. Here, the metal film 11a may have a single layer structure or a layered structure including an element selected from aluminum (Al), nickel (Ni), tungsten (W), molybdenum (Mo), titanium (Ti), platinum (Pt), copper (Cu), tantalum (Ta), gold (Au), and manganese (Mn), an alloy containing a plurality of the elements, or an alloy containing the element and carbon (C). In this embodiment mode, a metal containing Al is preferable; for example, an Al alloy containing C and Ti, an Al alloy containing Ni, an Al alloy containing C and Ni, an Al alloy containing C and Mn, or the like can be used. Note that if Al which is highly reflective is used for the metal film 11a, light emitted downward from the light emitting layer (the direction of the metal film 11a side) is reflected by the metal film; thus, more light can be extracted upward (the opposite side of the metal film 11a).

A light-transmitting conductive oxide material such as indium tin oxide (ITO), zinc oxide (ZnO), indium zinc oxide (IZO), or gallium-doped zinc oxide (GZO) can be used for the transparent electrode 11b. Alternatively, indium tin oxide containing silicon oxide or indium oxide containing silicon oxide to which zinc oxide (ZnO) is added in the range of 2 to 20% may be used. In this embodiment mode, indium tin oxide containing silicon oxide is used for the transparent electrode 11b.

The pixel electrode 11 and the wiring 14 are electrically connected to each other through a wiring 13 formed with a metal film. The wiring 13 can be formed along with the metal film 11a. In this case, the wiring 13 is formed with the same material as the metal film 11a. Further, they may be formed of respective materials. In this embodiment mode, the pixel electrode 11 and the wiring 13 are connected due to the contact between the transparent electrode 11b and the wiring 13. Specifically, the pixel electrode 11 has a narrow width region in the connection area between the pixel electrode 11 and the wiring 13. At least a part of the pixel electrode 11 in the narrow width region is formed only of the transparent electrode 11b. Note that the pixel electrode in the narrow width region may have any shape, and has a rectangular shape in this embodiment mode.

As thus described, the pixel electrode 11 has a two layer structure and a region 17 having a rectangular shape (hereinafter referred to as region 17) is formed; thus, when overcurrent flows into the pixel electrode 11, the current can be cut off or reduced. The principle will be briefly described below.

Since the width of the pixel electrode 11 is small in the region 17, when the current flows into the pixel, the current density in the region 17 is higher than that in the other part of the pixel electrode 11 than the region 17. If overcurrent flows into the pixel due to the damage to a TFT, a short circuit between an anode and a cathode, or the like, the current density in the region 17 is substantially increased. The current density of the region 17 is increased; accordingly, oxygen (O) of the transparent electrode 11b formed of indium tin oxide containing silicon oxide and Al of the metal film 11a are reacted to each other in the region 17 to form an aluminum oxide such as $Al_2O_3$ in the pixel electrode 11. As a result, the resistance of the pixel electrode 11 in the region 17 or the surrounding area increases to become insulative; thus, the current does not flow into the pixel electrode 11 or the flowing current is reduced.

Accordingly, in order to prevent overcurrent from flowing into the pixel, a pixel electrode having a structure in which the resistance of the pixel electrode itself increases only when current above a certain level flows into the pixel, so that current does not flow into the pixel may be provided. In order to realize the above structure, the pixel electrode 11 has a two layer structure of the metal film 11a and the transparent electrode 11b in this embodiment mode.

As the current density is higher, the metal film 11a and the wiring 13 react to each other and the resistance of the pixel electrode is increased. When overcurrent flows into the pixel, the current is cut off at the entrance of the pixel electrode; thus, the region 17 in which the current density of the flowing current is high is preferably provided in the region where the metal film 11a and the wiring 13 are connected. As a result, when the overcurrent flows, the resistance of the pixel electrode in the region 17 is selectively increased; thus, the current can be cut off and reduced at the entrance of the pixel electrode. Further, the shape of the pixel electrode in the region 17 is controlled to control whether to increase the resistance of the pixel electrode 11 or not in accordance with the current value.

In a display device using a light emitting element, in the case where a TFT controlling current or voltage supplied to a pixel is broken, high current continues to flow in a light emitting layer provided in the pixel; thus, the pixel constantly emits light. However, according to this embodiment mode, when high current flows in the pixel, the current flowing into the pixel can be cut off. Therefore, the pixel does not become a bright pixel defect and automatically becomes a dark pixel defect which does not emit light any more. The dark pixel defect is not prominent compared with a bright pixel defect in displaying an image; thus, the product quality can be assured.

By using a structure according to this embodiment mode, the problem of a defect caused due to a short circuit between an anode and a cathode can be prevented. In the case where a short circuit between an anode and a cathode is caused, high current is concentrated on the part; thus, adverse effects on the surrounding pixels due to increase in current consumption or heating become trouble. However, in this embodiment mode, in the case where overcurrent generated due to a short circuit between an anode and a cathode flows into the pixel, the current can be cut off and the adverse effects on the surrounding pixels can be reduced to a minimum.

This embodiment mode is described with reference to FIGS. 1A and 1B; however, the structure or the materials are not limited to those in FIGS. 1A and 1B. A material whose resistance is increased by reaction with the transparent electrode due to the flow of overcurrent can be used. For example, silver (Ag), tantalum (Ta), tungsten (W), copper (Cu), or the like may be used. The pixel electrode may be formed with a single layer. In this case, a metal film whose resistance is increased when current above a certain level flows may be used as the pixel electrode. Further, if the transparent electrode 11b and Al contained in the wiring 13 sufficiently react with each other when overcurrent flows, the metal film 11a may not necessarily be provided. In this case, the pixel electrode can be formed with only the transparent electrode 11b. In this embodiment mode, the pixel electrode 11 in the region 17 is formed with only the transparent electrode 11b; however, the region 17 may also have a two layer structure including the metal film 11a and the transparent electrode 11b the same as the other part of the pixel electrode.

End portions of the metal film 11a and the wiring 13 may be tapered. When the end portions of the metal film 11a and the wiring 13 are tapered, the transparent electrode 11b to be formed thereover may be prevented from breaking.

In this embodiment mode, the pixel electrode 11 in the region 17 having a rectangular shape is described; however, the invention is not limited thereto. The pixel electrode may have any shape as long as the current density in the area where the pixel electrode 11 and the wiring 13 are connected is higher than other part of the pixel electrode when current flows in the pixel. For example, shapes shown in FIGS. 6A to 6D can be adopted.

In FIGS. 6A to 6D, the pixel electrode 11 is divided into regions 17, 18, and 19, and the respective width are denoted by a, b, and c. Note that the region 17 and the region 19 denote the above described narrow width regions, and correspond to the protrusions of the pixel electrodes in FIGS. 6A to 6D.

Figure 6A:
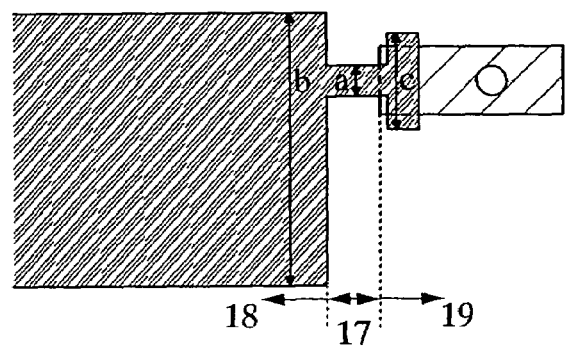
FIGS. 6A to 6D show connection between a pixel electrode and a wiring in a display device.

In FIGS. 1A and 1B, the width a of the region 17 is equal to the width c of the region 19 and is less than the width b of the region 18 (a=c<b). Alternatively, as shown in FIG. 6A, the pixel electrode may have a constricted shape (b>c>a) where the width a of the region 17 is less than the width b of the region 18 and the width c of the region 19.

Figure 6B:
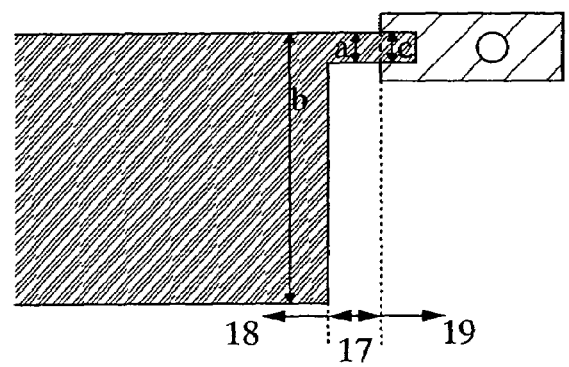
Figure 6C:
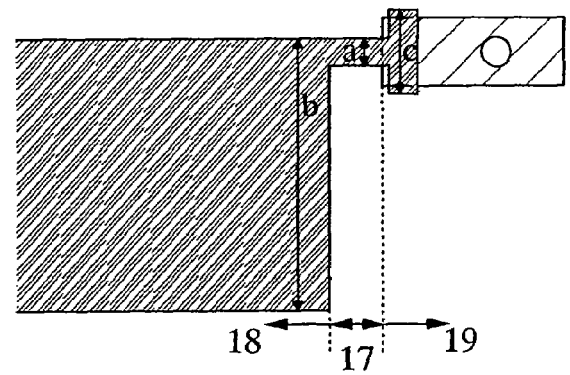
Figure 6D:
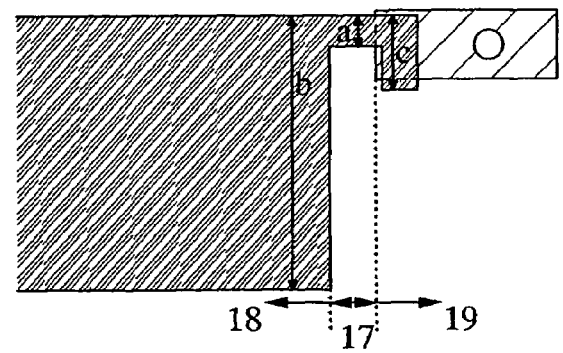

In other words, in this embodiment mode, the narrow width region of the pixel electrode (protrusions (the region 17 and the region 19)) may have any shape as long as the width a of the region 17 and the region 19 is narrower than the width b of the region 18. For example, the width a of the region 17 may be less than at least the width b of the region 18 and the width c of the region 19 (a<b, c) (FIGS. 6A, 6C, and 6D); or the width a of the region 17 may be equal to the width c of the region 19 and may be less than the width b of the region 18 (a=c<b) (FIGS. 1A and 1B, and FIG. 6B). Further, the width a of the region 17 is not necessarily be provided constant. For example, the width may increase toward the region 18, or toward the region 19.

Figure 3A:
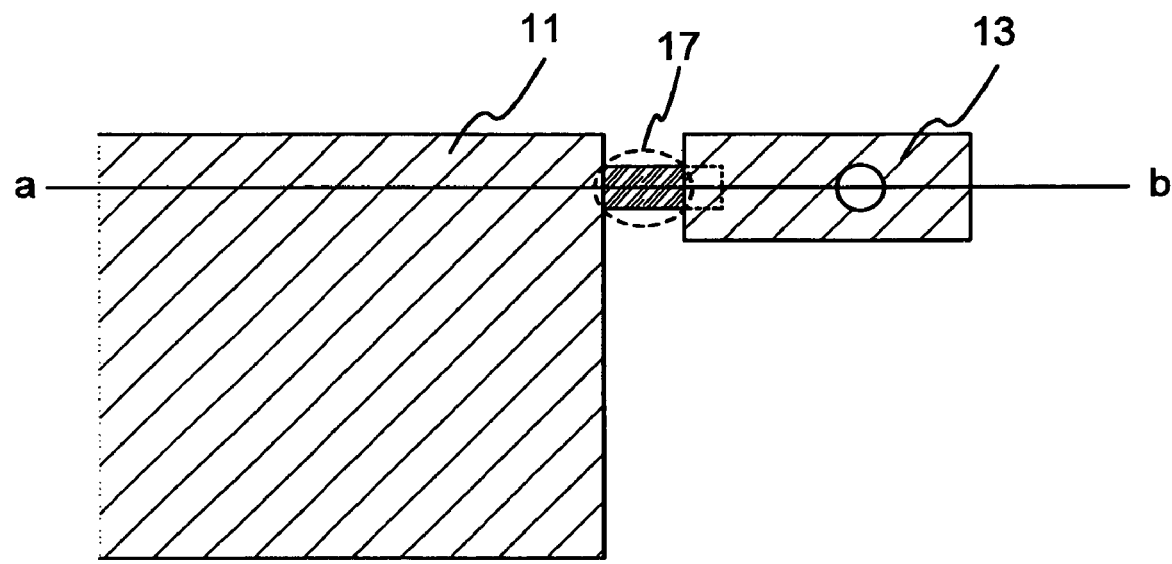
FIGS. 3A and 3B show a structure of a pixel electrode in a display device.
Figure 3B:
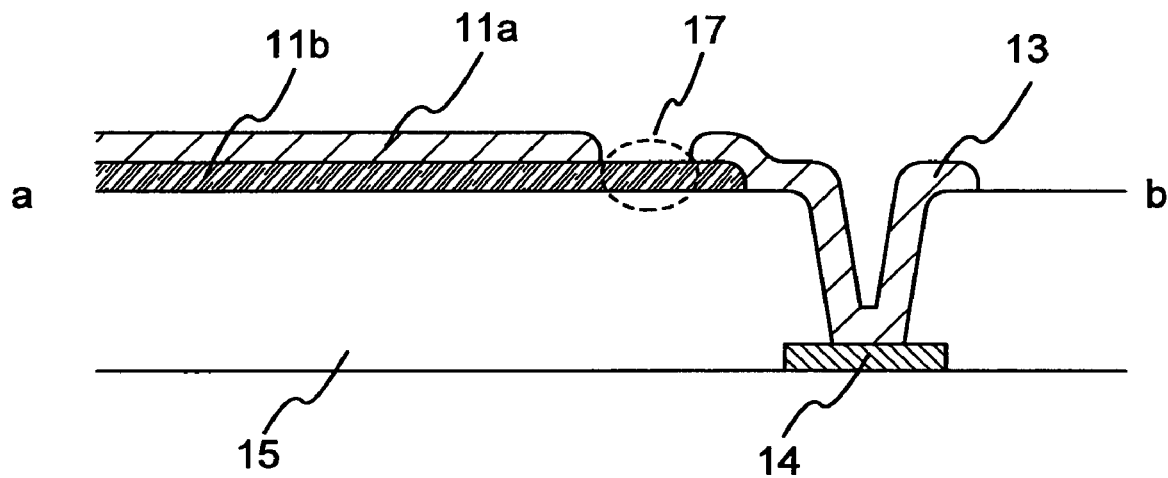

In this embodiment mode, the pixel electrode 11 has a structure in which the transparent electrode 11b is provided over the metal film 1a; however, another structure in which the metal film 11a is provided over the transparent electrode 11b (FIGS. 3A and 3B) may be employed. In this case, the metal film 11a and the wiring 13 are formed concurrently after forming the transparent electrode 11b.

Further, this embodiment mode can be applied to any active matrix display device using TFTs, for example to a liquid crystal display device or an organic EL display device.

As described above, according to this embodiment mode, in a display device even when a defect is caused in a pixel and overcurrent flows into the pixel, the current into the pixel is cut off or reduced, so that the generation of a bright pixel defect, and effects on the surrounding pixels due to increase in power consumption or temperature rise in a defect part are prevented; thus, the product quality of the display device can be assured.

Embodiment Mode 2

In this embodiment mode, an example of a display device different from Embodiment Mode 1 will be described with reference to FIGS. 2A to 2C.

Figure 2A:
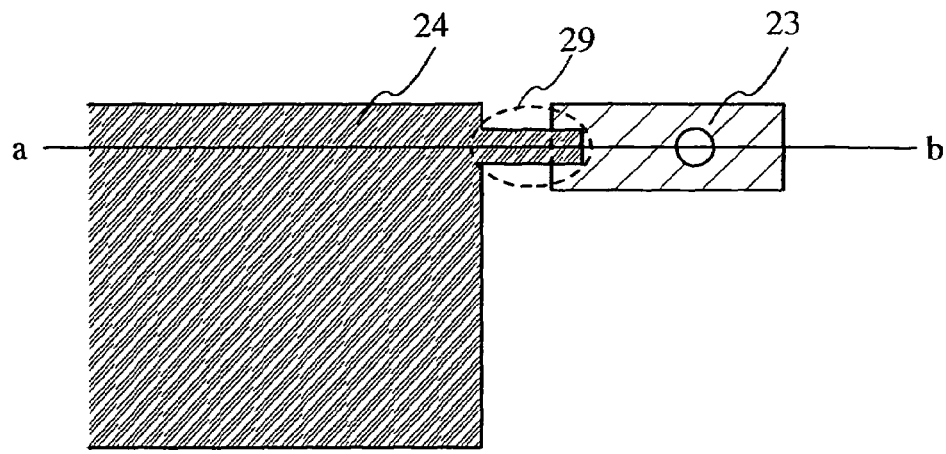
FIGS. 2A to 2C each show a structure of a pixel electrode in a display device.
Figure 2B:
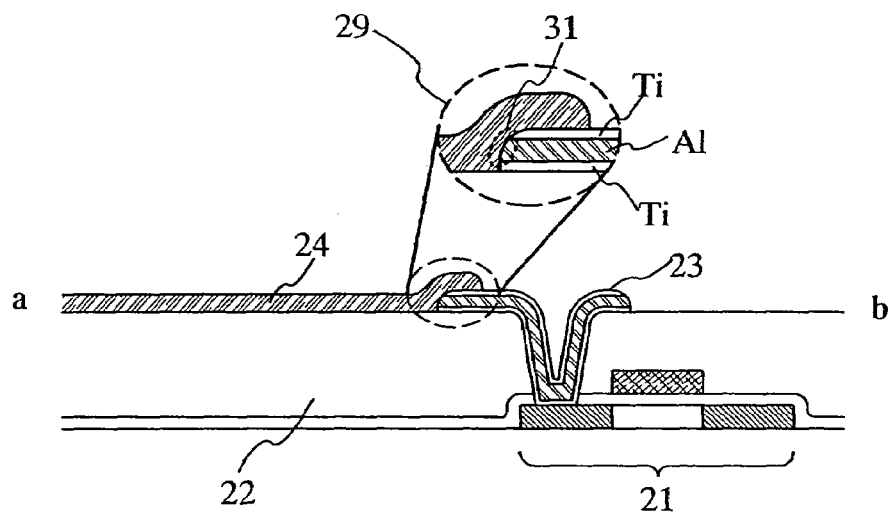
Figure 2C:
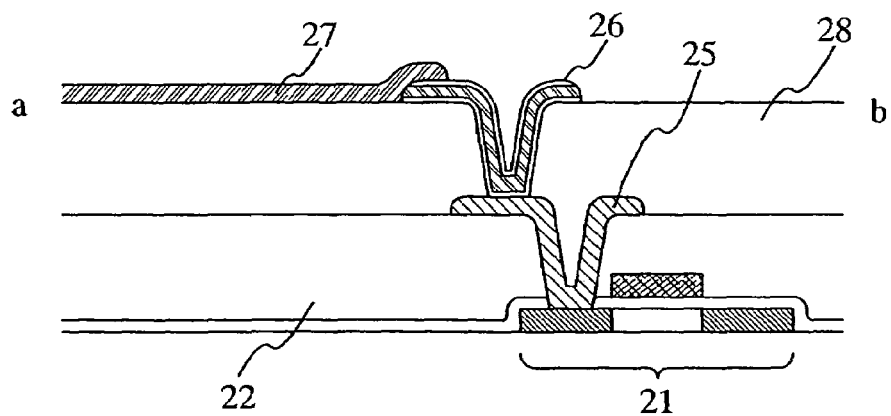

In FIGS. 2A to 2C, FIG. 2A shows a top view of a pixel electrode in a pixel of a display device, and FIG. 2B and FIG. 2C show a cross-sectional view thereof. A thin film transistor 21, an interlayer insulating film 22 covering the thin film transistor 21, and a wiring 23 over the interlayer insulating film 22 are formed. The wiring 23 is connected to the source or drain region of the thin film transistor 21 through a contact hole formed in the interlayer insulating film 22. Further, the pixel electrode 24 is electrically connected to the source or drain region of the thin film transistor 21 through the wiring 23. The wiring 23 may have a single layer structure or a layered structure including an element selected from aluminum (Al), nickel (Ni), tungsten (W), molybdenum (Mo), titanium (Ti), platinum (Pt), copper (Cu), tantalum (Ta), gold (Au), and manganese (Mn), an alloy containing a plurality of the elements, or an alloy containing the element and carbon (C). In this embodiment mode, a metal film formed in which Ti, Al, and Ti are sequentially stacked (also referred to as Ti/Al/Ti) is used for the wiring 23. The end portions of the wiring 23 formed on the interlayer insulating film 22 is tapered.

The pixel electrode 24 can be formed with a transparent electrode in a similar manner as Embodiment Mode 1. A light-transmitting conductive oxide material such as indium tin oxide (ITO), zinc oxide (ZnO), indium zinc oxide (IZO), or gallium-doped zinc oxide (GZO), or indium tin oxide containing silicon oxide or indium oxide containing silicon oxide, each of which is added with zinc oxide in the range of 2 to 20% can be used. In this embodiment mode, indium tin oxide containing silicon oxide is used for the pixel electrode 24. The pixel electrode 24 is made narrower in width, in the area where the pixel electrode 24 and the wiring 23 are connected, compared with the other part of the pixel electrode. With such a structure, when overcurrent flows into a pixel, the resistance of the pixel electrode 24 in a region 29 is increased as in Embodiment Mode 1; thus, the current flowing into the pixel can be cut off or reduced.

In this embodiment mode, when overcurrent flows into the pixel, in a region 31 where Al of the wiring 23 connected to the pixel electrode 24 is exposed, oxygen contained in the pixel electrode 24 reacts with Al contained in the wiring. Thus, an aluminum oxide such as $Al_2O_3$ is formed in the pixel electrode 24 or the wiring 23 in the region 29 or therearound, so that the resistance of the pixel electrode 24 or the wiring 23 is increased. Consequently, the current flowing into the pixel can be cut off or reduced as with Embodiment Mode 1.

Further, the exposed area of a cross section of the wiring 23 is increased by tapering the end portion of the wiring 23 formed with a laminate film in which Ti, Al, and Ti are sequentially stacked (Ti/Al/Ti). Accordingly, the area of the region 31 where the wiring 23 and the pixel electrode 24 are connected is increased; therefore, when overcurrent flows in the pixel, the reaction between oxygen of the pixel electrode 24 and the Al part of the wiring 23 can be caused more easily in the region 29. At the same time, the fracture or the like of the pixel electrode 24 formed over the wiring 23 can be prevented by tapering the end portion.

Further, other than the structure of FIG. 2B, a second interlayer insulating film 28 may be provided to cover the wiring 23 and a pixel electrode 27 may be formed over the second interlayer insulating film 28 as shown in FIG. 2C. In this case, the pixel electrode 27 is electrically connected to a wiring 25 through a metal film 26 in a contact hole formed in the second interlayer insulating film 28. The metal film 26 may be formed of the same material as the wiring 25 or may be formed with a single layer of Al. Further, the metal film may have a layered structure including multiple layers.

With the structure according to this embodiment mode, even when a defect is caused in a pixel due to damage of a TFT or a short circuit between an anode and a cathode, the effect of the defect can be reduced to a minimum as in Embodiment Mode 1. Further, in the structure of Embodiment Mode 1, the pixel electrode has a two layer structure of a metal film and a transparent electrode. Accordingly, a structure in which light is emitted upward (the opposite side of the pixel electrode) (top emission type) is often used in a display device using a light emitting element. However, in this embodiment mode, the pixel electrode uses only a transparent electrode. Therefore, a structure in which light is emitted downward (the pixel electrode side) (bottom emission type) or another structure in which light is emitted both upward and downward (dual emission type) can be employed as well as the top emission type.

This embodiment mode can be freely combined with the above embodiment mode.

Embodiment Mode 3

In this embodiment mode, a more specific structure of a display device of the invention and a manufacturing method thereof will be described with reference to FIGS. 4A to 4E and FIGS. 5A to 5D.

Figure 4A:
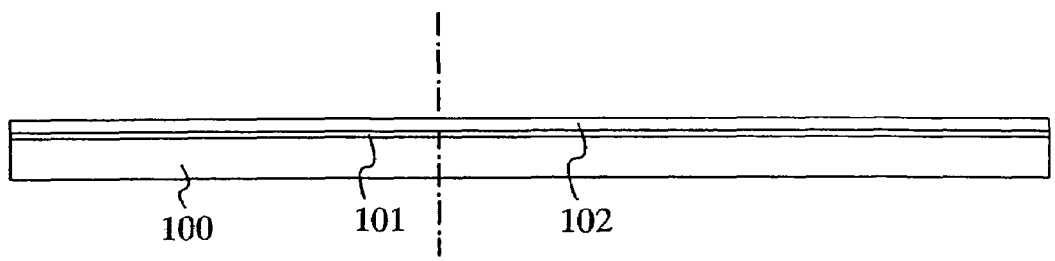
FIGS. 4A to 4E show an example of manufacturing steps of a display device.

First, a substrate 100 is prepared for forming a TFT and a light emitting element as shown in FIG. 4A. Specifically, a substrate formed of glass such as barium borosilicate glass or alumino borosilicate glass, a quartz substrate, a ceramic substrate, or the like can be used for the substrate 100. Alternatively, a metal substrate such as a stainless steel substrate or a substrate in which an insulating film is formed over a surface of the semiconductor substrate can be used. A substrate formed of a flexible synthetic resin such as plastic generally has lower heat resistance compared to the above substrates; however, such a substrate can be used if it can withstand the processing temperature in the manufacture steps. The surface of the substrate 100 may be planarized by polishing such as CMP.

Next, a base film 101 is formed over the substrate 100. In the case of using glass for the substrate 100, the base film 101 can prevent an alkaline metal such as Na and an alkaline earth metal contained in the substrate 100 from diffusing into a semiconductor film and exerting an adverse effect on characteristics of a semiconductor element. The base film 101 is therefore formed with an insulating film such as a silicon oxide film (SiO2 film), a silicon nitride film (SiN film), or a silicon nitride oxide film (SiNO film) capable of suppressing the diffusion of an alkaline metal or an alkaline earth metal in the semiconductor film. In this embodiment mode, a silicon nitride oxide film is formed to a thickness of 10 nm to 400 nm by plasma CVD. The base film 101 can be formed by a known method such as sputtering or low pressure CVD other than plasma CVD. In this embodiment mode, the base film 101 has a single layer structure; however, it may have a multilayer structure including two or more layers. Incidentally, it is effective to form the base film 101 in view of preventing impurity diffusion in the case of using a substrate, which contains a certain amount of alkaline metal or alkaline earth metal, such as a glass substrate, or a plastic substrate. However, the base film need not necessarily be formed in the case of using a quartz substrate or the like, in which impurity diffusion does not cause much trouble.

Next, an amorphous semiconductor film 102 is formed over the base film 101. The amorphous semiconductor film 102 is formed of silicon or a material mainly containing silicon (for example, SixGex-1) to a thickness of 25 to 80 nm. A known method may be used to form the amorphous semiconductor film 102, for example, sputtering, low pressure CVD, or plasma CVD.

Subsequently, the amorphous semiconductor film 102 is crystallized by a known crystallization method such as a laser crystallization method, a thermal crystallization method using RTA or an annealing furnace, a heat crystallization method using a metal element which promotes crystallization (FIG. 4A).

Figure 4B:
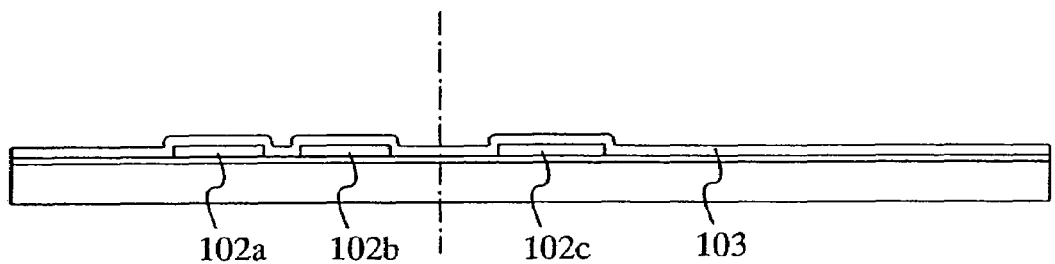

Next, the crystallized semiconductor film is etched to form semiconductor island films 102a to 102c. Subsequently, a gate insulating film 103 is formed so as to cover the semiconductor island films 102a to 102c (FIG. 4B). The gate insulating film 103 can be formed with a single layer or a laminate of a plurality of films using silicon oxide, silicon nitride, silicon oxynitride, or the like. The gate insulating film 103 can be formed by plasma CVD, sputtering, or the like. Here, an insulating film containing silicon is formed to a thickness of 30 nm to 200 nm by sputtering.

Figure 4C:
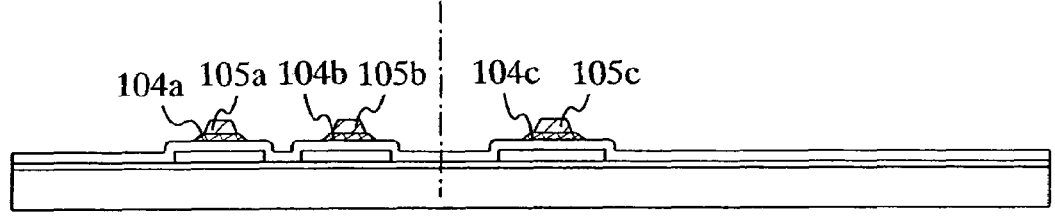

Subsequently, tantalum nitride (TaN) films are formed as first conductive layers 104a to 104c (gate electrodes) over the gate insulating film 103. Tungsten (W) films are formed thereover as second conductive layers 105a to 105c (FIG. 4C). Both of the TaN films and the W films may be formed by sputtering in such a way that the TaN films are formed using Ta target in a nitrogen atmosphere whereas the W films are formed using W target.

In this embodiment mode, the first conductive layers are formed of TaN, and the second conductive layers are formed of W; however, the invention is not limited thereto, and both of the first conductive layers and the second conductive layers may be formed of an element selected from tantalum (Ta), tungsten (W), titanium (Ti), molybdenum (Mo), aluminum (Al), copper (Cu), chrome (Cr), and neodymium (Nd), or an alloy material or a compound material mainly containing one of the elements. Further, a semiconductor film typified by a polycrystalline silicon film doped with an impurity element such as phosphorus may be used. An alloy of silver, palladium, and copper (AgPdCu alloy) may also be used. Still further, the combination may be appropriately selected. The thickness of the first conductive layers may be in the range from 20 nm to 100 nm, and the second conductive layers may be in the range from 100 nm to 400 nm. In addition, the two layer structure is employed in this embodiment mode; however, a single layer structure or a layered structure including three or more layers may be employed.

Next, a gate electrode or a resist is formed and patterned to be used as a mask. Impurities imparting n-type or p-type conductivity are selectively added to the semiconductor films 102a to 102c using the mask; thus, a source region, a drain region, and an LDD (Lightly Doped Drain) region, and the like are formed.

Figure 4D:
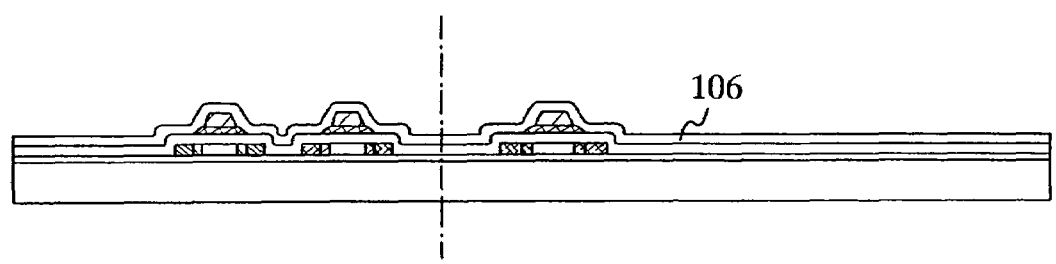

Subsequently, the mask formed of the resist is removed to form a first passivation film 106 (FIG. 4D). As the first passivation film 106, an insulating film containing silicon is formed to a thickness of 100 nm to 200 nm. The passivation film may be formed by plasma CVD or sputtering. In this embodiment mode, a silicon oxynitride film is formed by plasma CVD. In the case of using a silicon oxynitride film, a silicon oxynitride film (SiON film) formed of $SiH_4$, $N_2O$, and $NH_3$ by plasma CVD, or a silicon oxynitride film formed of $SiH_4$ and $N_2O$ may be formed. In this case, the film is formed under the following conditions: a reaction pressure of from 20 Pa to 200 Pa, a substrate temperature of 300° C. to 400° C., and a high frequency (60 MHz) power density of 0.1 W/cm$^2$ to 1.0 W/cm$^2$. Further, a hydrogenated silicon oxynitride film formed of $SiH_4$, $N_2O$, and $H_2$ may be employed as the first passivation film 106. Naturally, the first passivation film 106 is not limited to a single layer structure of the silicon oxynitride film as in this embodiment mode. A single layer of another insulating layer containing silicon or a layered structure including such an insulating layer may be used.

Thereafter, laser annealing is preferably carried out to recover crystallinity of the semiconductor film, and to activate the impurity element added to the semiconductor film. Heat treatment is carried out after the first passivation film 106 is formed; thus, hydrogenation of the semiconductor film can be carried out at the same time as the activation process. The hydrogenation is carried out to terminate dangling bonds in the first passivation film 106. Here, SiNO is used for the passivation film 106 and the heat treatment may be carried out at 410° C. in a nitrogen atmosphere.

Heat treatment may be carried out before forming the first passivation film 106. However, in the case where the materials constituting the first conductive layers 104a to 104c and the second conductive layers 105a to 105c are vulnerable to heat, it is preferable to carry out the heat treatment after forming the first passivation film 106 in order to protect wirings and the like. Further, in this case, the first passivation film is not formed yet; thus, hydrogenation cannot be performed by using hydrogen contained in the passivation film.

In such a case, hydrogenation may be carried out using hydrogen excited by plasma (plasma hydrogenation) or by heat treatment at a temperature of 300° C. to 450° C. for 1 to 12 hours in an atmosphere containing 3% to 100% of hydrogen.

Figure 4E:
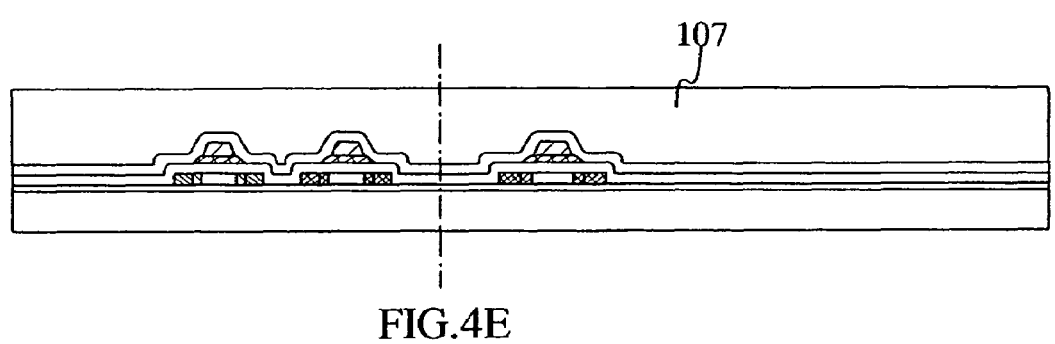

Subsequently, a first interlayer insulating film 107 is formed over the first passivation film 106 (FIG. 4E). The first interlayer insulating film 107 may be an inorganic insulating film or an organic insulating film. A silicon oxide film formed by CVD, a silicon oxide film applied by SOG (Spin On Glass), or the like may be used for the inorganic insulating film. A film of polyimide, polyamide, BCB (benzocyclobutene), acrylic or positive photosensitive organic resin, negative photosensitive organic resin and the like may be used as the organic insulating film. Moreover, a layered structure of the acryl film and the silicon oxynitride film may be used.

A siloxane resin or the like can be used for the first interlayer insulating film. Incidentally, a siloxane resin is a resin containing a Si—O—Si bond. The skeleton of siloxane is composed of a bond of silicon (Si) and oxygen (O). An organic group which contains at least hydrogen (for example, an alkyl group and aromatic hydrocarbon) may be used as the substituent. A fluoro group may also be used as the substituent. Alternatively, both an organic group which contains at least hydrogen and a fluoro group may be used.

With the use of the above material, an interlayer insulating film with enough insulating properties and planarity can be obtained even if the thickness is thin. Further, the above material is highly resistant to heat; thus, an interlayer insulating film which can withstand the reflow process in a multilayer wiring can be formed. Further, an interlayer insulating film with less dehydration can be formed due to low hygroscopicity of the material.

In this embodiment mode, a siloxane based polymer is used for forming the first interlayer insulating film. Irregularities on the substrate due to TFTs can be alleviated and planarized using the first interlayer insulating film 107. The interlayer insulating film 107 specifically functions to planarize; thus, an insulating film is preferably formed with a material which can be easily planarized. Alternatively, SiON can be used for the first interlayer insulating film. In this case, the first passivation film may not necessarily be provided.

Thereafter, a second passivation film formed of a silicon nitride oxide film or the like may be formed over the first interlayer insulating film 107. The second passivation film may be formed to a thickness of approximately 10 nm to 200 nm, which can protect the first interlayer insulating film 107 from moisture. Alternatively, a silicon nitride film, an aluminum nitride film, an aluminum oxynitride film, a diamond-like carbon (DLC) film, or a carbon nitride (CN) film can be used as the second passivation film.

A film formed by RF sputtering has high density and good barrier performance. In the case of forming a silicon oxynitride film, for example, RF sputtering is performed using Si target, and $N_2$, Ar, $N_2O$ with the gas flow ratio of 31:5:4 under the pressure of 0.4 Pa, and at the power of 3000 W. In the case of forming a silicon nitride oxide film, for example, RF sputtering is performed using Si target and $N_2$ and Ar in the chamber with the gas flow ratio of 1:1 under a pressure of 0.8 Pa, and at the power of 3000 W at a temperature of 215° C.

Figure 5A:
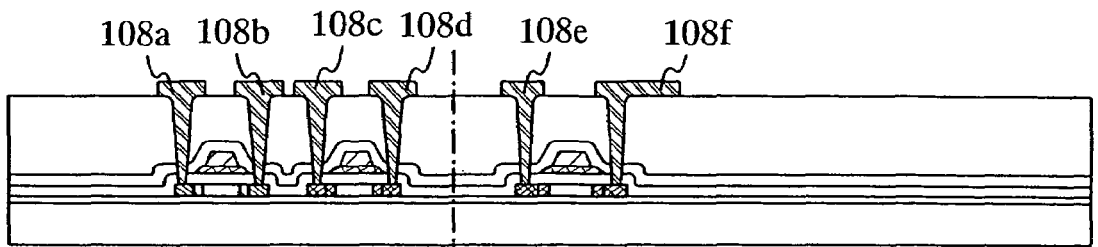
FIGS. 5A to 5D show an example of manufacturing steps of a display device.

Next, the first interlayer insulating film 107 and the first passivation film 106 are etched to form contact holes reaching the source regions and drain regions. Subsequently, wirings 108a to 108f each of which is electrically connected to each source region and each drain region are formed (FIG. 5A). The wirings 108a to 108f may each have a single layer structure or a layered structure including an element selected from aluminum (Al), nickel (Ni), tungsten (W), molybdenum (Mo), titanium (Ti), platinum (Pt), copper (Cu), tantalum (Ta), gold (Au), and manganese (Mn), an alloy containing a plurality of the elements, or an alloy containing the element and carbon (C). Here, the wirings 108a to 108f are preferably formed with a metal film containing Al. In this embodiment mode, a laminate of a Ti film and an alloy film containing Al and Ti is patterned to form the wirings 108a to 108f. Naturally, the wirings may have a single layer structure or a layered structure including three or more layers without limitation to the two layer structure. Further, the material of the wirings is not limited to Al and Ti. For example, an Al film or a Cu film may be formed over the TaN film, and a Ti film may be formed thereover to be patterned, thereby forming the wirings 108a to 108f.

Next, a second interlayer insulating film 109 is formed to cover the wirings 108a to 108f. The same material as the first interlayer insulating film can be used for the second interlayer insulating film. In this embodiment mode, a siloxane based polymer is used for the second interlayer insulating film 109. Since a siloxane based polymer is highly resistant to heat, an interlayer insulating film which can withstand the reflow process in a multilayer wiring can be obtained.

Figure 5B:
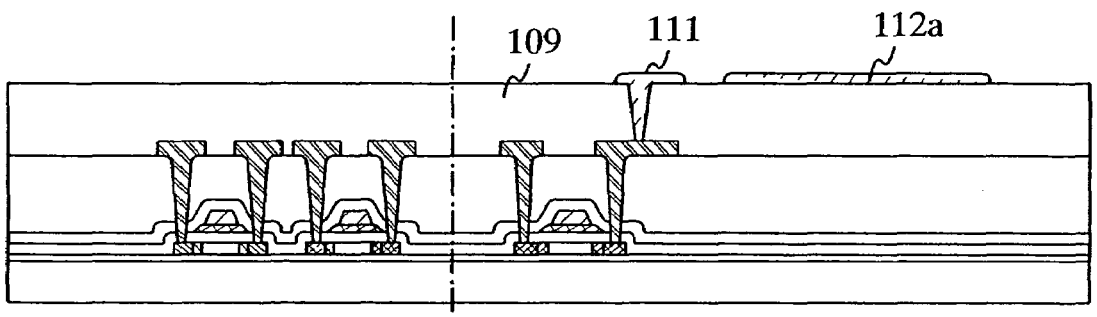

Next, the second interlayer insulating film 109 is selectively etched to form a contact hole. Subsequently, a wiring 111 is formed to connect to the wiring 108f. A pixel electrode 112a is formed concurrently with the wiring 111 (FIG. 5B). The wiring 111 and the pixel electrode 112a may each have a single layer structure or a layered structure including an element selected from aluminum (Al), nickel (Ni), tungsten (W), molybdenum (Mo), titanium (Ti), platinum (Pt), copper (Cu), tantalum (Ta), gold (Au), and manganese (Mn), an alloy containing a plurality of the elements, or an alloy containing the element and carbon (C). In this embodiment mode, an Al alloy may be used. Here, an Al alloy containing Ni and C is used.

Figure 5C:
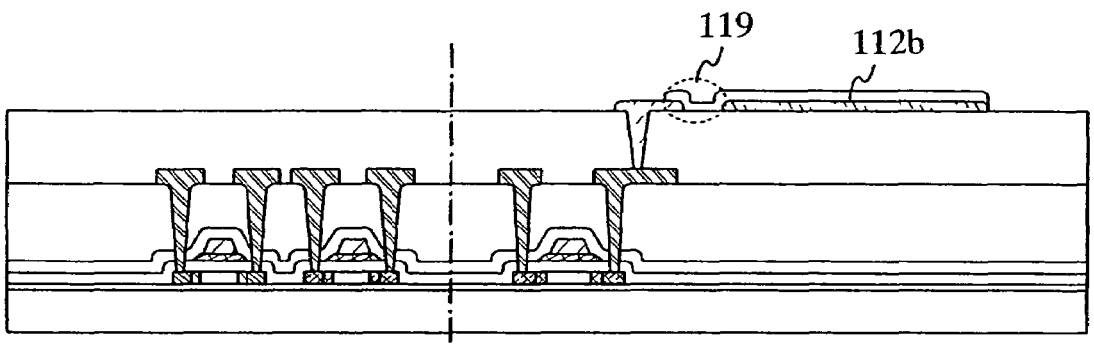

A pixel electrode 112b is formed over the second interlayer insulating film 109, the wiring 111, and the pixel electrode 112a (FIG. 5C). The pixel electrode 112b is formed to have narrower shape at least in the area where the wiring 111 and the pixel electrode 112a are not overlapped than the other part of the pixel electrode 112b. A light-transmitting conductive oxide material such as indium tin oxide (ITO), zinc oxide (ZnO), indium zinc oxide (IZO), or gallium-doped zinc oxide (GZO) can be used for the pixel electrode 112b. Alternatively, indium tin oxide containing silicon oxide or indium oxide containing silicon oxide in which zinc oxide (ZnO) is added in the range of 2 to 20% may be used.

Figure 5D:
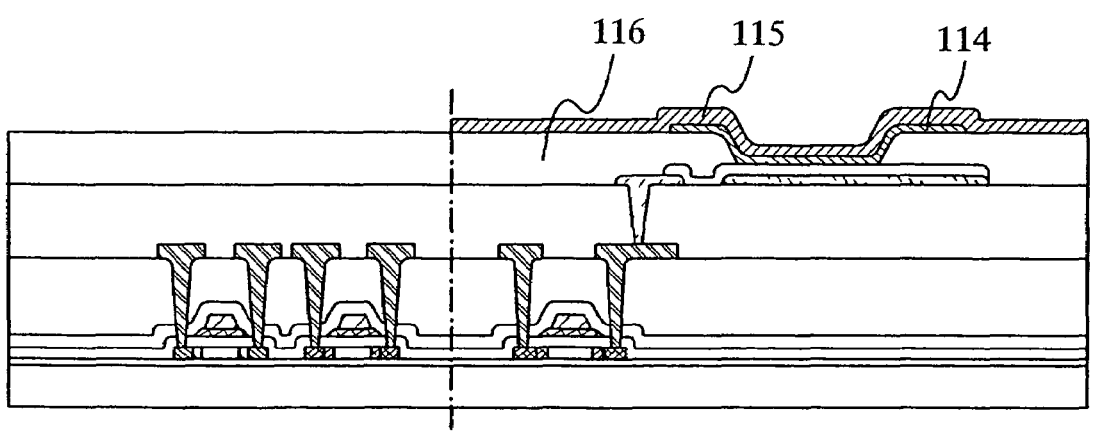

Next, an insulating film (bank) 116 is formed to cover end portions of the pixel electrodes 112a and 112b so that an electroluminescent layer 114 is formed to contact the pixel electrode 112b. Subsequently, an electrode 115 is formed and stacked directly on the electroluminescent layer 114 (FIG. 5D). In the case where the electrode 115 is a cathode, a metal, an alloy, an electrically conductive compound, or a mixture of these materials which has low work function, or the like is used. Specifically, in addition to an alkali metal such as Li or Cs; an alkaline earth metal such as Mg, Ca, or Sr; an alloy containing thereof (for example, Mg:Ag, Al:Li, or Mg:In); a compound thereof ($CaF_2$, Ca3N2 or the like); a rare-earth metal such as Yb or Er can be used. When an electron injection layer is provided, another conductive layer such as an Al layer may be used. In the case of taking out light from the cathode side, another light-transmitting conductive oxide material such as indium tin oxide (ITO), zinc oxide (ZnO), indium zinc oxide (IZO), and gallium-doped zinc oxide (IZO) can be used. In addition, indium tin oxide containing silicon oxide or indium oxide containing silicon oxide in which 2% to 20% of zinc oxide (ZnO) is further mixed may be used. In the case of using the light-transmitting conductive oxide material, an electron injection layer is desirably provided in the electroluminescent layer 114 to be formed later. Light can be taken out from the cathode side, without using the light-transmitting conductive oxide material, by forming the cathode with a film thickness thin enough to transmit light preferably about 5 nm to 30 nm. In this case, a light-transmitting conductive film may be formed using a light-transmitting conductive oxide material so as to be in contact with the top (the opposite surface of the electroluminescent layer 114 side) or the bottom (the surface of the electroluminescent layer 114 side) of the cathode, in order to suppress sheet resistance of the cathode.

Through the above steps, the display device shown in FIG. 5D can be manufactured. This embodiment mode can be freely combined with any one of the above embodiment modes.

Embodiment Mode 4

Figure 7A:
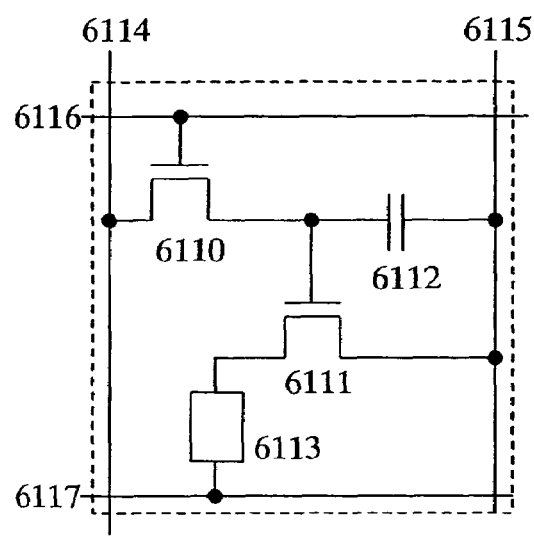
FIGS. 7A to 7C each show an example of a circuit diagram in a display device.

A pixel circuit of a display device using a light emitting element will be described with reference to FIGS. 7A to 7C. FIG. 7A is an equivalent circuit diagram of a pixel. The pixel includes a TFT 6110 for controlling a video signal input to the pixel, a TFT 6111 for controlling a value of a current flowing between both electrodes of a light emitting element 6113, and a capacitor 6112 for holding gate-source voltage of the TFT 6111, which are arranged in an area surrounded by wirings of a signal line 6114, power supply lines 6115 and 6117, and a scan line 6116. Although the capacitor 6112 is shown in FIG. 7A, it is not necessarily provided when the gate capacitance of the TFT 6111 or other parasitic capacitance can suffice.

Figure 7B:
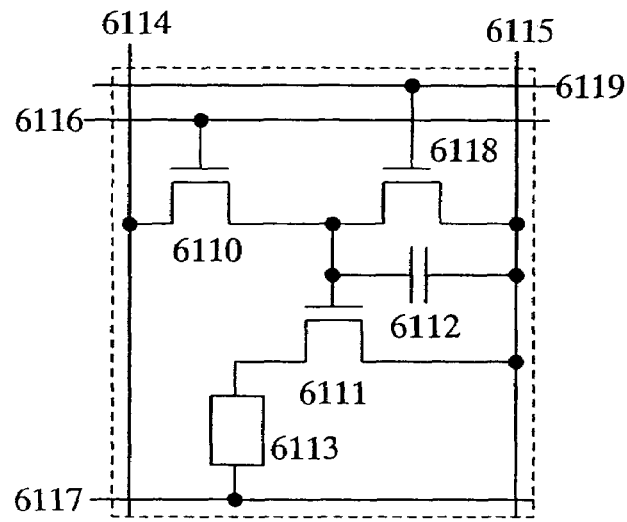

FIG. 7B is a pixel circuit in which a TFT 6118 and a scan line 6119 are added to the pixel shown in FIG. 7A. The TFT 6118 can forcibly stop current flowing to the light emitting element 6113; thus, a lighting period can start simultaneously with or immediately after a writing period without waiting for signals to be written in all the pixels. Consequently, the duty ratio is increased and moving images can be especially displayed in high quality.

Figure 7C:
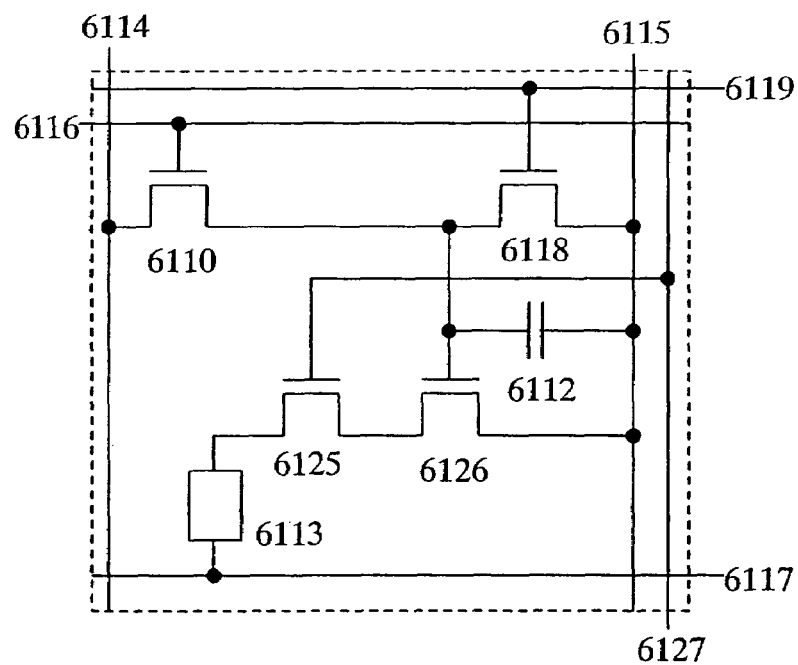

FIG. 7C is a pixel circuit in which TFTs 6125 and 6126 and a wiring 6127 are added to the pixel shown in FIG. 7B, and in which the TFT 6111 is omitted. In this configuration, a gate electrode of the TFT 6125 is connected to the wiring 6127 having a constant potential to fix the potential of the gate electrode, and the TFT 6125 operates in the saturation region. The TFT 6126 is connected in series to the TFT 6125 and operates in the linear region. A video signal for transmitting an information of lighting or non-lighting of the pixel is inputted to a gate electrode of the TFT 6126 through the TFT 6110. A small fluctuation in the voltage between the gate and the source (referred to as gate-source) of the TFT 6126 does not affect the value of the current flowing in the light emitting element 6113 since the TFT 6126 operating in the linear region has the low voltage between the source and the drain. Accordingly, the value of the current to flow in the light emitting element 6113 is determined by the TFT 6125 operating in the saturation region. The channel length $L_1$ and the channel width $W_1$ of the TFT 6125 and the channel length $L_2$ and channel width $W_2$ of the TFT 6126 may be set to satisfy $L_1/W: L_2/W_2$=5000 to 6000:1. It is preferable that the TFT 6125 and the TFT 6126 have the same conductivity in view of the manufacturing steps. A depletion mode TFT as well as an enhancement mode TFT may be used as the TFT 6125.

Figure 8:
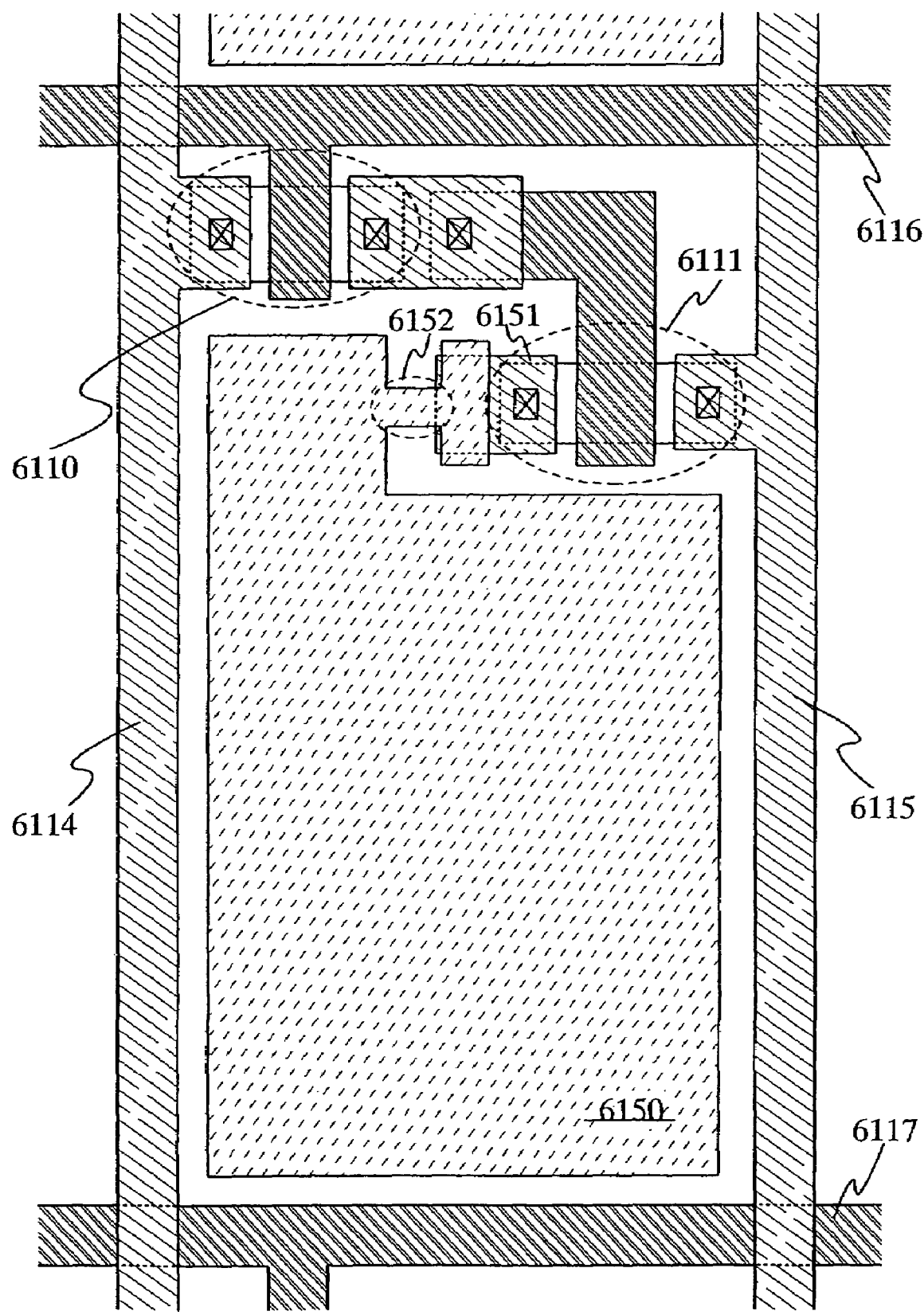
FIG. 8 shows a top view of a pixel in a display device.

A circuit diagram corresponding to FIG. 7A is shown in FIG. 8. In FIG. 8, a material for forming a pixel electrode 6150 and the structure thereof may be the same as the above embodiment mode. As shown in FIG. 8, in a region 6152 where the pixel electrode 6150 and a wiring 6151 are connected to each other, the pixel electrode 6150 is formed to be narrower than the other part of the pixel electrode 6150. In this embodiment mode, the part of the pixel electrode 6150 in the region 6152 is constricted. With such a structure, when high current flows in the pixel, resistance of the pixel electrode 6150 in the region 6152 is increased and the current flowing in the pixel is cut off or reduced. The shape of the pixel electrode 6150 is not limited to the constricted shape; however, any of the structures described in the above embodiment mode may be employed.

When a pixel having a multi gray scale is displayed in a display device, either an analog driving method using an analog video signal or a digital driving method using a digital video signal is used as a driving method. The difference between the two methods is a controlling method of a light emitting element in a light emitting/non-light emitting state. In the analog driving method, gray scale level is adjusted by controlling current flowing in a light emitting element. Meanwhile, in the digital driving method, gray scale level is adjusted by using only two states of a light emitting element: on-state (where the luminance is approximately 100%) and off-state (where the luminance is approximately 0%). If only the on-state and the off-state are used in the digital driving method, an image can be displayed with only two gray scale levels. Therefore, in order to display a multi gray scale image, the digital driving method is performed in combination with another method such as an area gray scale method or a time gray scale method.

In the case of using a digital video signal, the video signal may use either voltage or current. That is, a video signal inputted to a pixel in light emission of a light emitting element may have either a constant voltage or a constant current. When a video signal has a constant voltage, a constant voltage is applied to a light emitting element or a constant current flows to the light emitting element. Meanwhile, when a video signal has a constant current, a constant voltage is applied to a light emitting element or a constant current flows in the light emitting element. A driving method in which a constant voltage is applied in a light emitting element is constant voltage drive. Meanwhile, a driving method in which a constant current flows to a light emitting element is constant current drive. In the case of the constant current drive, a constant current flows regardless of changes in resistance of a light emitting element.

In the display device of the invention, either the analog driving method or the digital driving method may be used for either a liquid crystal panel or a light emitting panel. The digital driving method may be combined with either the area gray scale method or the time gray scale method. Other driving methods that are not described in this embodiment mode may be used as well. Further, either the constant voltage drive or the constant current drive may be used.

This embodiment mode can be freely combined with anyone of the above embodiment modes.

Embodiment Mode 5

A panel that is one mode of a display device according to the invention will be described with reference to FIGS. 10A and 10B.

Figure 10A:
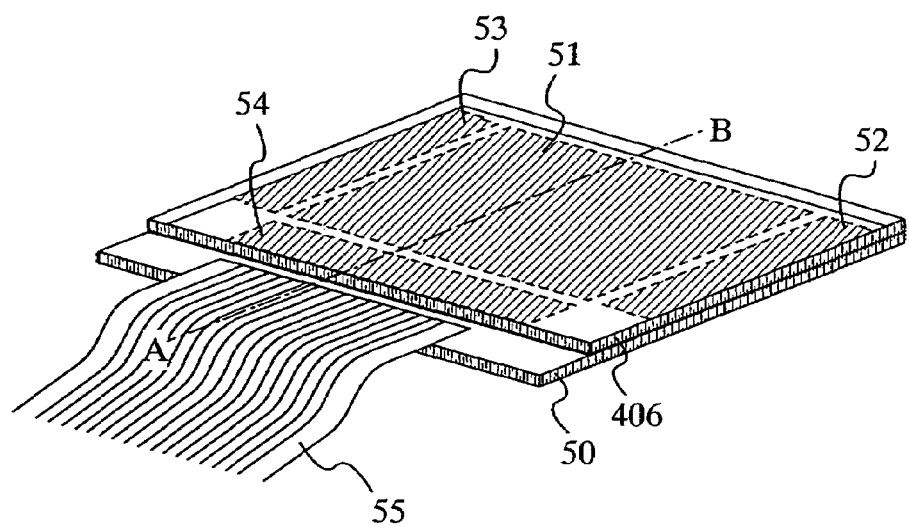
FIGS. 10A and 10B each show a panel of a display device.

A display area 51 with a plurality of pixels each including a light emitting element, gate drivers 52 and 53, a source driver 54, and a connection film 55 are provided over a substrate 50 (FIG. 10A). The connection film 55 is connected to an IC chip or the like.

Figure 10B:
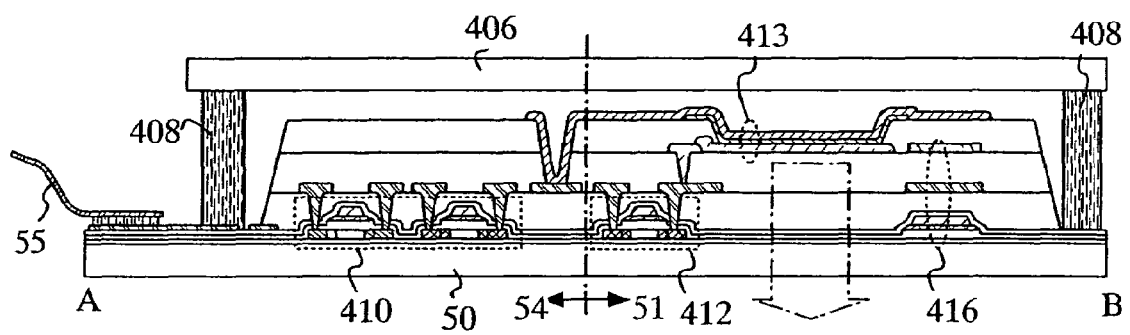

FIG. 10B shows a cross sectional view taken along line A-B of a panel, in which a transistor 412, a light emitting element 413, and a capacitor 416 are provided in the display area 51 and an element group 410 is provided in the source driver 54.

A sealing material 408 is provided around the display area 51, the gate drivers 52, 53 and the source driver 54. The light emitting element 413 is sealed with the sealing material 408 and a counter substrate 406. This sealing treatment is carried out to protect the light emitting element 413 from moisture. Here, a method for sealing the light emitting element 413 with a cover member (such as glass, ceramic, plastic, or metal) is employed. Alternatively, a method for sealing it with a thermosetting resin or an ultraviolet curable resin, or a method for sealing it with a thin film with high barrier property such as a metal oxide film or a nitride film may be employed. The elements formed over the substrate 50 are preferably formed of a crystalline semiconductor (polysilicon) with good characteristics such as high mobility as compared with an amorphous semiconductor, so that the elements are monolithically integrated over the same surface. The number of external ICs connected to the panel having the above structure is reduced; thus, the panel can be made small, light and thin.

The display area 51 may be formed by using a transistor using an amorphous semiconductor formed on an insulated surface as a channel region while a circuit for controlling the display area 51 may be formed with IC chips. The amorphous semiconductor can be easily formed over a large size substrate by CVD without a crystallization step; therefore, an inexpensive panel can be provided. Further, when a conductive layer is formed by a droplet discharge method on this occasion, a more inexpensive panel can be provided. The IC chips may be attached to the substrate 50 by a COG (Chip On Glass) method, or to the connection film 55 connecting to the substrate 50. The droplet discharge method is a method by which a droplet (also referred to as a dot) of a composition containing a conductive or insulative material is selectively discharged (sprayed) to be applied to an arbitrary location. The droplet discharge method includes an inkjet method.

Figure 11A:
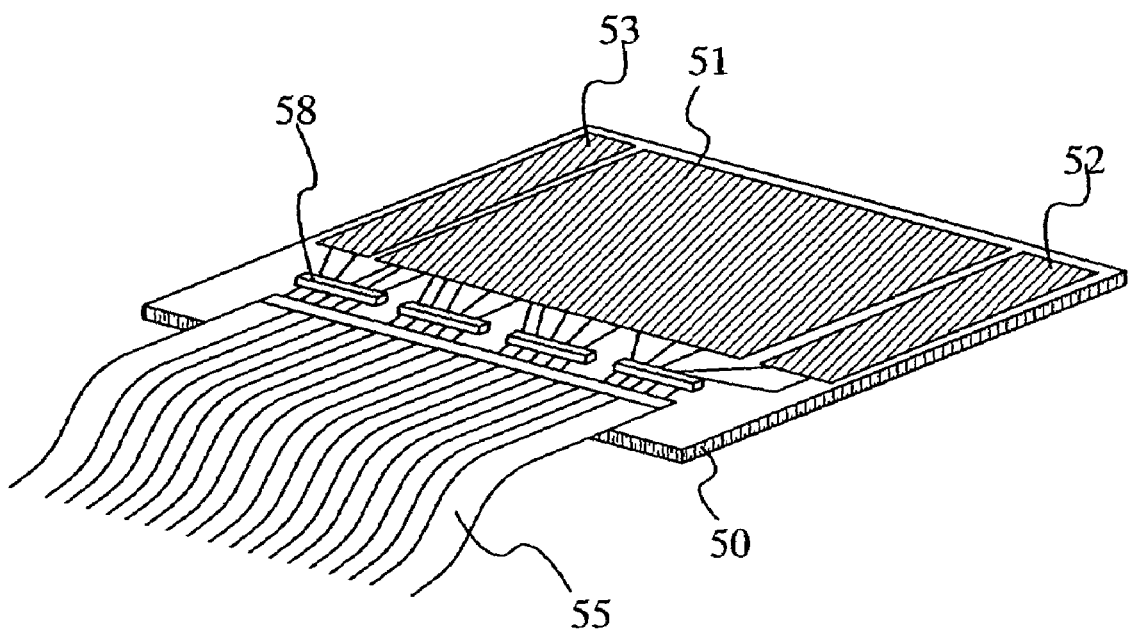
FIGS. 11A and 11B each show a panel of a display device.
Figure 11B:
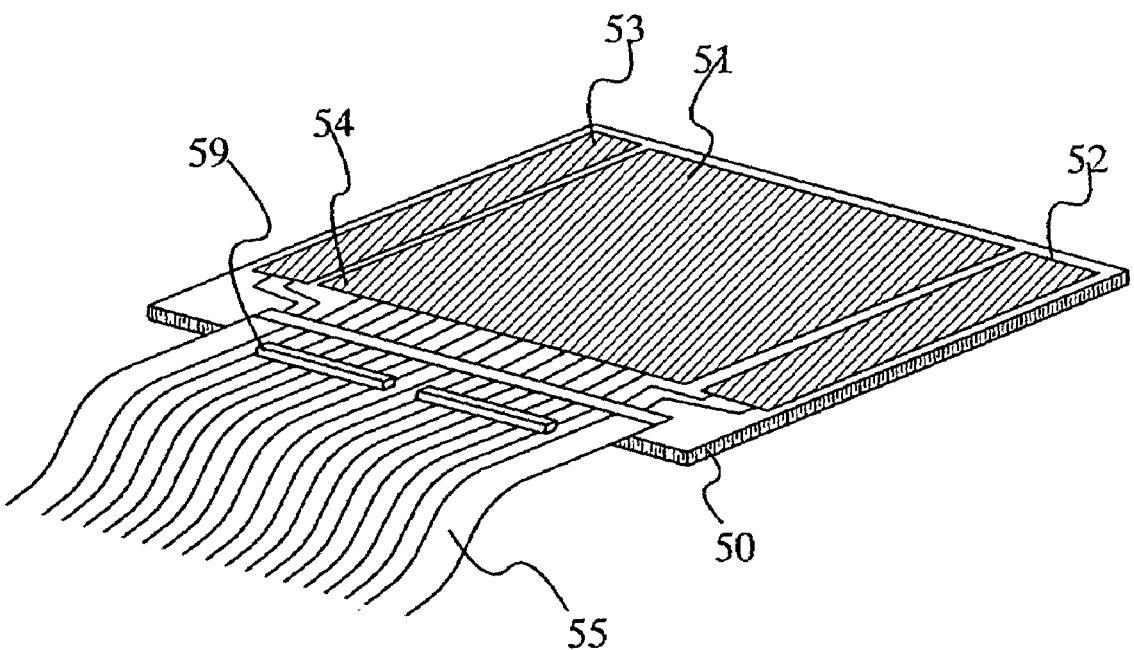

Here, the state of mounting chip ICs (IC chips) on an element substrate provided with a display area including a plurality of pixels is shown in FIGS. 11A and 11B. In FIG. 11A, a display area 51 and gate drivers 52 and 53 are formed over a substrate 50. A source driver formed in an IC chip 58 is mounted on the substrate 50. The source driver formed in the IC chip 58 is specifically attached onto the substrate 50 to be electrically connected to the display area 51. Power source potential, various signals, or the like are supplied to the display area 51, the gate drivers 52 and 53, and the source driver formed in the IC chip 58 through the connection film 55.

In FIG. 11B, a display area 51 and gate drivers 52 and 53 are formed over a substrate 50. A source driver formed in an IC chip 59 is mounted on a connection film 55 that is mounted on the substrate 50. Power source potential, various signals, or the like are supplied to the display area 51, the gate driver 52, and the source driver formed in the IC chip 59 through the connection film 55.

The mounting method of IC chips is not limited in particular. A known COG method, a wire bonding method, a TAB method, and the like can be used. The position of mounting IC chips is not limited to the position shown in FIGS. 11A and 11B as long as the IC chips can be electrically connected. In FIGS. 11A and 11B, an example of forming only a source driver with an IC chip is shown; whoever, the gate driver may be formed with an IC chip instead. Further, a controller, a CPU, a memory, and the like may be formed with IC chips to be mounted on the substrate. Still further, only part of the circuit constituting each driver circuit may be formed with IC chips instead of forming the whole source driver and the whole gate driver with IC chips.

Integrated circuits such as a driver circuit are separately formed with IC chips to be mounted; thus, the production yield can be increased and the optimization of processes corresponding to each circuit can easily be carried out compared with the case of forming all circuits over one substrate provided with a pixel.

Although not shown in FIGS. 11A and 11B, a protective circuit may be provided over a substrate provided with a display area. A discharge path can be secured due to the protective circuit, which avoids noises of a signal and the power source voltage and prevents deterioration or dielectric breakdown of a semiconductor element formed over a substrate due to a charge charged in an insulating film for any reason. In the case of FIG. 11A, specifically, a protective circuit can be connected to a wiring electrically connecting the connection film 55 to the display area 51. Further, a protective circuit can be connected to each of a wiring electrically connecting the connection film 55 to the IC chip 58 provided with the source drive, a wiring electrically connecting the connection film 55 to the gate drivers 52 and 53, a wiring (source line) electrically connecting the IC chip 58 provided with the source driver to the display area 51, and a wiring (gate line) electrically connecting the gate drivers 52 and 53 to the display area 51.

This embodiment mode can be freely combined with any one of the above embodiment modes.

Embodiment Mode 6

Next, a structure of a light emitting element will be described with reference to FIG. 9. An element structure of a display device using a light emitting element according to the invention is schematically shown in FIG. 9.

Figure 9:
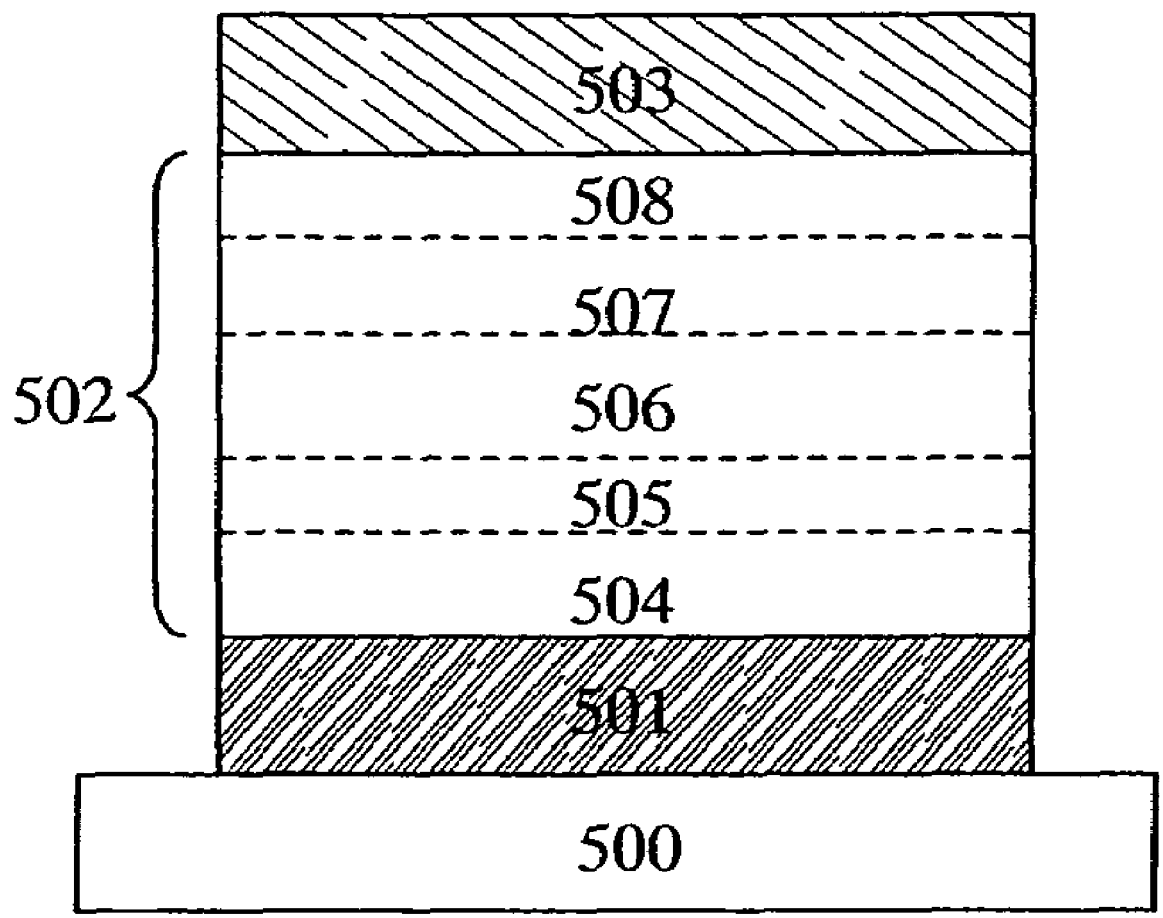
FIG. 9 shows a structure of a light emitting element included in a display device.

A light emitting element shown in FIG. 9 includes a first electrode 501 formed over a substrate 500, an electroluminescent layer 502 formed over a first electrode 501, and a second electrode 503 formed over an electroluminescent layer 502. In practice, various layers, a semiconductor element, or the like is provided between the substrate 500 and the first electrode 501.

In this embodiment mode, the case where the first electrode 501 is an anode and the second electrode is a cathode is described; however, the first electrode may be a cathode and the second electrode may be an anode.

The electroluminescent layer 502 is formed to have a single or a plurality of layers. In the case of a structure of plural layers, the following layers in terms of carrier transporting properties may be classified as a hole injection layer, a hole transport layer, a light emitting layer, an electron transport layer, an electron injection layer and the like. Note that the boundary of each layer is not necessarily distinct and the boundary can not be distinguished clearly in some cases since the materials forming the respective layers are partially mixed into the adjacent layers. Each of the layers may be formed of an organic material or an inorganic material. As for the organic material, any one of a high molecular weight material (also referred to as polymer), an intermediate molecular weight material and a low molecular weight material can be used. The intermediate molecular weight material is a low polymer in which the number of repeated structural units (the degree of polymerization) is about 2 to 20.

There is no clear distinction between the hole injection layer and the hole transport layer, and both of the layers are the same in the sense that hole transportability (hole mobility) is specially important property. A layer in contact with the anode is referred to as the hole injection layer and a layer in contact with the hole injection layer is referred to as the hole transport layer for distinction. The same applies to the electron transport layer and the electron injection layer. A layer in contact with the cathode is referred to as the electron injection layer and a layer in contact with the electron injection layer is referred to as the electron transport layer. In some cases, the light emitting layer is combined with the electron transport layer, and it is referred to as a light emitting electron transport layer. Shown in FIG. 9 is an example where the electroluminescent layer 502 includes a first layer 504 to a fifth layer 508. The first layer 504 to the fifth layer 508 are stacked in order from the first electrode 501 to the second electrode 503.

Since the first layer 504 functions as a hole injection layer, a material having hole transportability, relatively low ionization potential, and high hole injectability is desirably used. Such a material can roughly be classified into a metal oxide, a low molecular weight organic compound, and a high molecular weight organic compound. As for the metal oxide, for example, vanadium oxide, molybdenum oxide, ruthenium oxide, aluminum oxide, or the like can be used. As for the low molecular weight organic compound, for example, starburst amine typified by m-MTDATA, metallophthalocyanine typified by copper phthalocyanine (abbreviated to Cu—Pc), phthalocyanine (abbreviated to H2-Pc), 2,3-dioxyethylene thiophene derivative, or the like can be used. Alternatively, a film in which a low molecular weight organic compound and the aforementioned metal oxide are codeposited may be used.

As for the high molecular weight organic compound, for example, a high molecular weight material such as polyaniline (abbreviated to PAni), polyvinylcarbazole (abbreviated to PVK), or polythiophene derivative can be used. Alternatively, polyethylene dioxythiophene (abbreviated to PEDOT) as one of the polythiophene derivative doped with polystyrenesulphonic acid (abbreviated to PSS) may be used. In addition, benzoxazole derivative may be used in combination with one or more of TCQn, $FeCl_3$, $C_{60}$, and $F_4TCNQ$.

Since the second layer 505 functions as a hole transport layer, a known material having high hole transportability and low crystallinity is desirably used. Specifically, an aromatic amine-based compound (namely, the one having benzene ring-nitrogen bonds) is suitable. For example, there are 4,4'-bis[N-(3-methylphenyl)-N-phenyl-amino]-biphenyl (TPD), and its derivative: 4,4'-bis[N-(1-naphthyl)-N-phenyl-amino]-biphenyl (a-NPD), and the like. Alternatively, 4,4',4"-tris(N, N-diphenyl-amino)-triphenylamine (TDATA), or a starburst aromatic amine compound such as MTDATA can be used. In addition, 4,4'-4"-tris(N-carbazolyl)triphenylamine (abbreviated to TCTA) may be used. In addition, a high molecular weight material such as polyvinylcarbazole exhibiting good hole transportability can be used.

Since the third layer 506 functions as a light emitting layer, a material having high ionization potential and a large bandgap is desirably used. Specifically, a metal complex such as tris(8-quinolinolato)aluminum ($Alq_3$), tris(4-methyl-8-quinolinolato)aluminum ($Almq_3$), bis(10-hydroxybenzo[η]-quinolinato)beryllium ($BeBq_2$), bis(2-methyl-8-quinolinolate)-(4-hydroxy-biphenylyl)aluminum (BAlq), bis[2-(2-hydroxyphenyl)-benzoxazolato]zinc ($Zn(BOX)_2$), or bis[2-(2-hydroxyphenyl)-benzothiazolato]zinc ($Zn(BTZ)_2$) can be used. Alternatively, various fluorescent pigments (such as a coumarin derivative, a quinacridone derivative, rubrene, 4,4-dicyanomethylene, a 1-pyrone derivative, a stilbene derivative, and various condensed aromatic compounds) can be used. In addition, a phosphorescent material such as a platinum octaethylporphyrin complex, a tris(phenyl pyridine) iridium complex, and a tris(benzylidene acetonate) phenanthrene europium complex can be used as well.

As a host material used for the third layer 506, a hole transporting material or an electron transporting material typified by the aforementioned examples can be used. Alternatively, a bipolar material such as 4,4'-N,N'-dicarbazolyl-biphenyl (abbreviated to CBP) can be used Since the fourth layer 507 functions as an electron transport layer, a material having high electron transportability is desirably used. Specifically, a metal complex having quinoline skeleton or benzoquinoline skeleton typified by $Alq_3$ or a mixed ligand complex thereof can be used. In particular, a metal complex such as $Alq_3$, $Almq_3$, $BeBq_2$, BAlq, $Zn(BOX)_2$, or $Zn(BTZ)_2$ can be used. Furthermore, other than a metal complex, an oxadiazole derivative such as 2-(4-biphenylyl)-5-(4-tert-buthylphenyl)-1,3,4-oxadiazole (PBD), or 1,3-bis[5-(p-tert-butylphenyl)-1,3,4-oxadiazole-2-yl]benzene (OXD-7); a triazole derivative such as 3-(4-tert-butylphenyl)-4-phenyl-5-(4-biphenylyl)-1,2,4-triazole (TAZ), or 3-(4-tert-butylphenyl)-4-(4-ethylphenyl)-5-(4-biphenylyl)-1,2,4-triazole (p-EtTAZ), an imidazole derivative such as TPBI; or a phenanthroline derivative such as bathophenanthroline (BPhen) or bathocuproine (BCP) can be used for the electron transporting material.

Since the fifth layer 508 functions as an electron injection layer, a material having high electron injectability is desirably used. Specifically, an ultra thin film formed of an insulator such as an alkaline metal halide such as LiF and CsF, an alkaline earth halide such as $CaF_2$, and an alkaline metal oxide typified by $Li_2O$ is generally used. Alternatively, an alkaline metal complex such as lithium acetylacetonate (abbreviated to Li(acac)) and 8-quinolinolato-lithium (abbreviated to Liq) are also effective. In addition, the fifth layer 508 may include a metal oxide such as molybdenum oxide (MoOx), vanadium oxide (VOx), ruthenium oxide (RuOx), tungsten oxide (WOx) or benzoxazole derivative, and one or more of an alkaline metal, an alkaline earth metal and a transition metal. Alternatively, titan oxide may be used.

In a light emitting element having the above structure, voltage is applied between the first electrode 501 and the second electrode 503 and forward bias current is supplied to the electroluminescent layer 502; thus, light can be emitted from the third layer 506 to the first electrode 501 side or the second electrode 503 side. It should be noted that the electroluminescent layer 502 does not necessarily include the first to fifth layers. According to the invention, it is required to have at least the third layer 506 that functions as a light emitting layer. In addition, light emission is not limited to the one from the third layer 506, and it can be obtained from a layer other than the third layer 506 depending on a combination of materials used for the first to fifth layers. In addition, a hole blocking layer may be provided between the third layer 506 and the fourth layer 507.

It should be noted that depending on the color, lower voltage drive and higher reliability can be achieved by using a phosphorescent material than a fluorescent material. Accordingly, in the case of performing full color display using light emitting elements corresponding to the three primary colors, the light emitting elements of the respective colors may be made to have the same deterioration level as possible by combining a light emitting element using a fluorescent material and a light emitting element using a phosphorescent material.

FIG. 9 shows the case where the first electrode 501 is an anode, and the second electrode 503 is a cathode. Meanwhile, in the case where the first electrode 501 is a cathode, and the second electrode 503 is an anode, the first layer 504 to the fifth layer 508 are stacked in reverse order. Specifically, the fifth layer 508, the fourth layer 507, the third layer 506, the second layer 505, and the first layer 504 are stacked in order over the first electrode 501.

In the electroluminescent layer 502, a material that is resistant to etching is used for a layer which is closest to the second electrode 503. In the Embodiment Mode, the layer is the fifth layer 508. Thus, when the second electrode 503 is formed over the electroluminescent layer 502 by sputtering, the sputtering damage to the layer which is closest to the second electrode 503 can be reduced. For example, a metal oxide such as molybdenum oxide (MoOx), vanadium oxide (VOx), ruthenium oxide (RuOx), tungsten oxide (WOx), or the like; or a benzoxazole derivative can be used as the material that is resistant to etching. The material is preferably formed by evaporation.

For example, in the case where the first electrode is a cathode and the second electrode is an anode, the above described material that is resistant to etching is used for a hole injectable or hole transportable layer in the electroluminescent layer, which is closest to the anode. Specifically, in the case of using a benzoxazole derivative, a layer including the benzoxazole derivative and one or more materials of TCQn, $FeCl_3$, $C_{60}$, and $F_4$-TCNQ are formed to be closest to the anode.

On the other hand, in the case where the first electrode is an anode and the second electrode is a cathode, the above described material that is resistant to etching is used for an electron injectable or electron transportable layer in the electroluminescent layer, which is closest to the cathode. Specifically, in the case of using molybdenum oxide, a layer including the molybdenum oxide and one or more materials of an alkali metal, an alkali earth metal, and a transition metal is formed to be closest to the cathode. In the case of using a benzoxazole derivative, a layer containing the benzoxazole derivative and one or more materials of an alkali metal, an alkali earth metal, and a transition metal is formed to be closest to the cathode. The metal oxide and a benzoxazole derivative may be used in combination.

With the above structure, even when a transparent conductive film formed by sputtering using, for example, indium tin oxide (ITO), indium tin oxide containing silicon oxide (ITSO), or IZO (indium zinc oxide) in which indium oxide is mixed with zinc oxide (ZnO) of 2% to 20% is used as the second electrode, sputtering damage to a layer including an organic material of the electroluminescent layer can be suppressed. Further, the material for forming the second electrode becomes more selective.

Embodiment Mode 7

Examples of electronic devices using a display device having a structure according to the invention can be given as follows: a video camera; a digital camera; a goggle type display (head mounted display); a navigation system; an audio reproducing device (car audio, an audio component, or the like); a computer; a game machine; a portable information terminal (a mobile computer, a cellular phone, a portable game machine, an electronic book, or the like); an image reproducing device including a recording medium (specifically, a device capable of reproducing a recording medium such as a digital versatile disc (DVD) and having a display that can display the image of the data); and the like. Practical examples of those electronic devices are shown in FIGS. 12A and 12H.

Figure 12A:
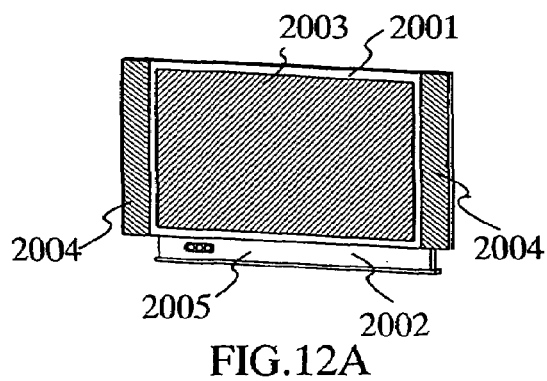
FIGS. 12A to 12H each show an electronic device using a display device of the invention.

FIG. 12A shows a television receiver machine including a chassis 2001, a supporting stand 2002, a display area 2003, speaker units 2004, a video input terminal 2005, and the like. The television receiver machine can be manufactured by applying a display device described in any one of the above embodiment modes to the display area 2003.

Figure 12B:
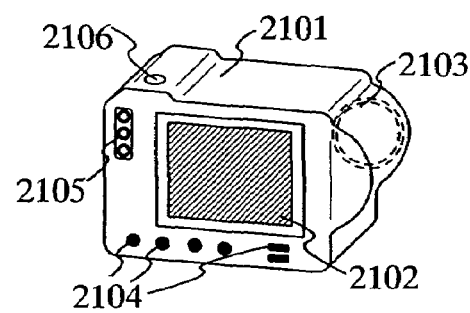

FIG. 12B shows a digital camera including a main body 2101, a display area 2102, an image receiving portion 2103, operation keys 2104, an external connection port 2105, a shutter 2106, and the like. The digital camera can be manufactured by applying a display device described in any one of the above embodiment modes to the display area 2102.

Figure 12C:
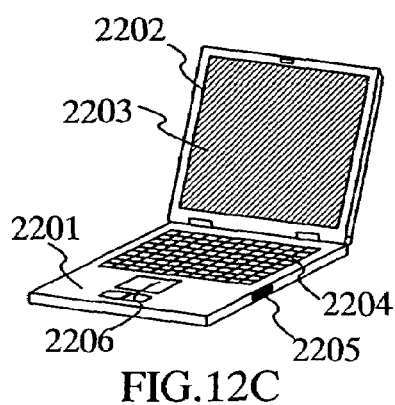

FIG. 12C shows a computer including a main body 2201, a chassis 2202, a display area 2203, a keyboard 2204, an external connection port 2205, a pointing mouse 2206, and the like. The computer can be manufactured by applying a display device described in any one of the above embodiment modes to the display area 2203.

Figure 12D:
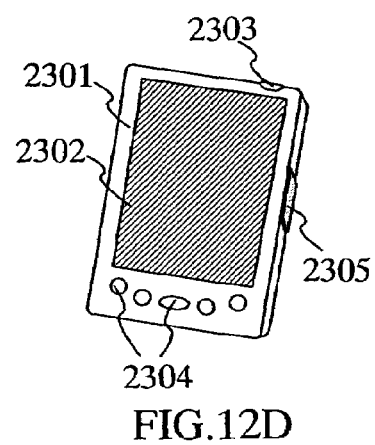

FIG. 12D shows a mobile computer including a main body 2301, a display area 2302, a switch 2303, operation keys 2304, an infrared port 2305, and the like. The mobile computer can be manufactured by applying a display device described in any one of the above embodiment modes to the display area 2302.

Figure 12E:
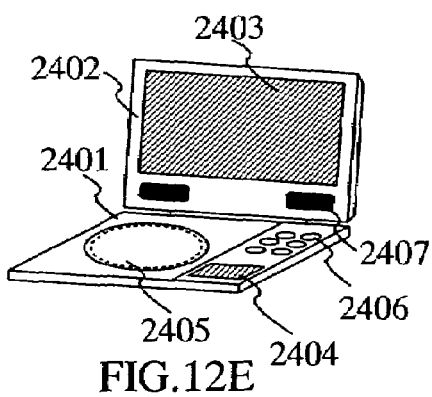

FIG. 12E shows a mobile image reproduction device equipped with a recording medium (DVD, and the like) (such as a DVD reproduction device) including a main body 2401, a chassis 2402, a display area A 2403, a display area B 2404, a recording-medium reader portion 2405, an operation key 2406, a speaker unit 2407, and the like. The display area A 2403 mainly displays image information, while the display area B 2404 mainly displays text information. The image reproduction device can be manufactured by applying a display device described in any one of the above embodiment modes to the display area A 2403 and the display area B 2404. The image reproduction device equipped with a recording medium includes the game machine and the like.

Figure 12F:
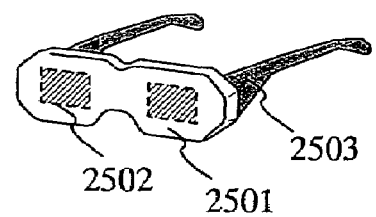

FIG. 12F shows a goggle type display (head mount display) including a main body 2501, a display area 2502, and an arm portion 2503. The goggle type display can be manufactured by applying a display device described in any one of the above embodiment modes to the display area 2502.

Figure 12G:
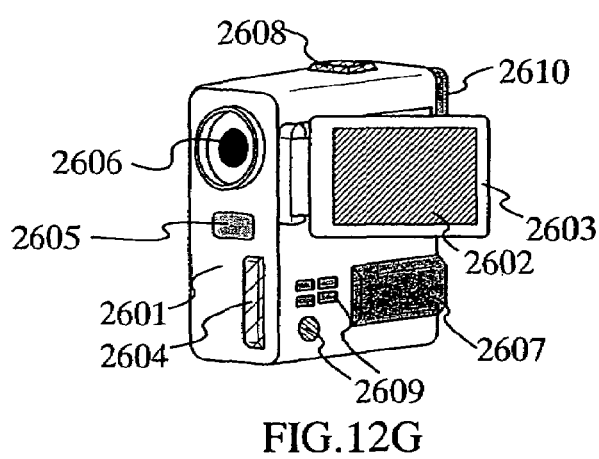
Figure 12H:
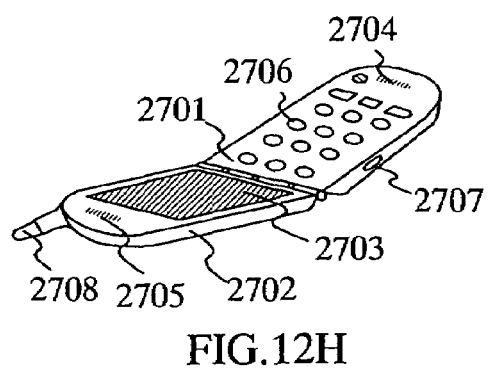

FIG. 12G shows a video camera including a main body 2601, a display area 2602, a chassis 2603, an external connection port 2604, a remote controller receiving portion 2605, an image receiving portion 2606, a battery 2607, an audio input portion 2608, operation keys 2609, an eyepiece portion 2601, and the like. The video camera can be manufactured by applying a display device described in any one of the above embodiment modes to the display area 2602.

FIG. 12H shows a cellular phone including a main body 2701, a chassis 2702, a display area 2703, an audio input portion 2704, an audio output portion 2705, an operation key 2706, an external connection port 2707, an antenna 2708, and the like. The cellular phone can be manufactured by applying a display device described in any one of the above embodiment modes to the display area 2703.

Other than the above electronic devices, a display device described in any one of the above embodiment modes can be applied to a front type or rear type projector.

As thus described, the present invention can be applied in a wide range, and can be applied to electronic devices in all fields. This embodiment mode can be freely combined with any one of the above embodiment modes.

What is claimed is:

1. A display device comprising:
a wiring over an insulating surface;
a metal film over the insulating surface so as to separate from the wiring;
a transparent conductive film provided so as to cover the metal film; and
a light emitting layer over the transparent conductive film,
wherein the transparent conductive film has a first portion over the metal film, a second portion over the insulating surface and a third portion over the wiring, the second portion being located between the wiring and the metal film,
wherein a width of the second portion is smaller than a width of the first portion, a width of the third portion, and a width of the wiring, and
wherein the transparent conductive film covers an end portion of the wiring.

2. A display device according to claim 1,
wherein the metal film and the wiring are formed of a same material.

3. A display device according to claim 1,
wherein the transparent conductive film is formed of a light-transmitting oxide material.

4. A display device according to claim 1
wherein the wiring is formed of an alloy containing Al, Ti and C, an alloy containing Al and Ni, or an alloy containing Al, Ni and C.

5. A display device according to claim 1,
wherein the display device is incorporated in an electronic device selected from the group consisting of a television receiver machine, a digital camera, a computer, a mobile computer, a mobile image reproduction device, a goggle type display, a video camera, and a cellular phone.

6. A display device according to claim 1,
wherein a side surface of the metal film is coplanar with a side surface of the transparent conductive film.

7. A display device according to claim 1,
wherein each of the end portion of the wiring and an end portion of the metal film is tapered.

8. A display device comprising:
a pixel electrode comprising at least a metal film and a transparent conductive film; and
a wiring over an insulating surface,
wherein the transparent conductive film extends beyond an edge of the metal film, and
wherein the transparent conductive film has a first portion over the metal film, a second portion over the insulating surface and a third portion over the wiring, the second portion being located between the wiring and the metal film,
wherein a width of the second portion is smaller than a width of the first portion, a width of the third portion, and a width of the wiring, and
wherein the wiring is in contact with the third portion of the transparent conductive film.

9. A display device according to claim 8,
wherein the metal film and the wiring are formed of a same material.

10. A display device according to claim 8,
wherein the transparent conductive film is formed of a light-transmitting oxide material.

11. A display device according to claim 8,
wherein the wiring is formed of an alloy containing Al, Ti and C, an alloy containing Al and Ni, or an alloy containing Al, Ni and C.

12. A display device according to claim 8,
wherein the display device is incorporated in an electronic device selected from the group consisting of a television receiver machine, a digital camera, a computer, a mobile computer, a mobile image reproduction device, a goggle type display, a video camera, and a cellular phone.

13. A display device according to claim 8,
wherein a side surface of the metal film is coplanar with a side surface of the transparent conductive film.

14. A display device according to claim 8,
wherein each of an end portion of the wiring and an end portion of the metal film is tapered.

15. A display device comprising:
a thin film transistor over a substrate, the thin film transistor including a semiconductor film, a conductive layer, and a gate insulating film between the semiconductor film and the conductive layer;
an insulating film having a contact hole over the thin film transistor;
a wiring over the insulating film and being electrically connected to the thin film transistor through the contact hole;
a first electrode over the insulating film and comprising a metal film and a transparent conductive film over the metal film;
a bank over the insulating film and the wiring and covering an end portion of the first electrode;
an electroluminescent layer over the first electrode and in contact with the transparent conductive film; and
a second electrode over the electroluminescent layer, wherein the metal film is apart from the wiring,
wherein the transparent conductive film has a first portion over the metal film, a second portion over the insulating film and a third portion over the wiring, the second portion being located between the wiring and the metal film,
wherein a width of the second portion is smaller than a width of the first portion, a width of the third portion, and a width of the wiring, and
wherein the transparent conductive film covers the metal film and an end portion of the wiring.

16. A display device according to claim 15,
wherein the metal film and the wiring are formed of a same material.

17. A display device according to claim 15,
wherein the transparent conductive film is formed of a light-transmitting oxide material.

18. A display device according to claim 15,
wherein the wiring is formed of an alloy containing Al, Ti and C, an alloy containing Al and Ni, or an alloy containing Al, Ni and C.

19. A display device according to claim 15,
wherein the display device is incorporated in an electronic device selected from the group consisting of a television receiver machine, a digital camera, a computer, a mobile computer, a mobile image reproduction device, a goggle type display, a video camera, and a cellular phone.

20. A display device according to claim 15,
wherein a side surface of the metal film is coplanar with a side surface of the transparent conductive film.

21. A display device according to claim 15,
wherein each of the end portion of the wiring and an end portion of the metal film is tapered.

* * * * *